(12) United States Patent
Jung et al.

(10) Patent No.: US 12,069,903 B2
(45) Date of Patent: Aug. 20, 2024

(54) DISPLAY DEVICE HAVING A TRANSPARENT MASK THAT INCLUDES A TRANSPARENT OXIDE

(71) Applicant: Samsung Display Co., LTD., Yongin-si (KR)

(72) Inventors: Yang Ho Jung, Seoul (KR); Jun Gi Kim, Hwaseong-si (KR); Jae Hun Lee, Seongnam-si (KR); Bo Geon Jeon, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/220,195

(22) Filed: Jul. 10, 2023

(65) Prior Publication Data

US 2023/0354650 A1 Nov. 2, 2023

Related U.S. Application Data

(63) Continuation of application No. 17/141,222, filed on Jan. 5, 2021, now Pat. No. 11,711,947.

(30) Foreign Application Priority Data

Jan. 15, 2020 (KR) .................. 10-2020-0005206

(51) Int. Cl.
*H10K 59/122* (2023.01)
*H10K 50/84* (2023.01)
(Continued)

(52) U.S. Cl.
CPC ........... *H10K 59/122* (2023.02); *H10K 50/84* (2023.02); *H10K 50/865* (2023.02); *H10K 59/353* (2023.02)

(58) Field of Classification Search
CPC .... H10K 59/122; H10K 59/353; H10K 50/84; H10K 50/865
(Continued)

(56) References Cited

U.S. PATENT DOCUMENTS 7,019,801 B2 3/2006 Ueki et al.
7,609,339 B2 10/2009 Choi
(Continued)

FOREIGN PATENT DOCUMENTS

KR 10-2002-0037443 5/2002
KR 10-1268954 5/2013
(Continued)

OTHER PUBLICATIONS

Non-Final Office Action dated Dec. 22, 2012, issued to U.S. Appl. No. 17/141,222.
(Continued)

*Primary Examiner* — Xia L Cross
(74) *Attorney, Agent, or Firm* — CANTOR COLBURN LLP

(57) ABSTRACT

A display device includes a plurality of first electrodes electrically connected to pixel circuits disposed on a substrate; a pixel defining layer defining a plurality of opening regions, each of the opening regions exposing a portion of each of the first electrodes; a plurality of light emitting layers respectively disposed on the first electrodes in the opening regions; a second electrode covering the light emitting layers and the pixel defining layer; an encapsulation layer disposed on the second electrode; and a plurality of light blocking patterns disposed on the encapsulation layer between the opening regions adjacent to each other in a first direction.

20 Claims, 18 Drawing Sheets

(51) Int. Cl.
*H10K 50/86* (2023.01)
*H10K 59/35* (2023.01)

(58) Field of Classification Search
USPC .......................................................... 257/40
See application file for complete search history.

(56) References Cited

U.S. PATENT DOCUMENTS

| | | | |
|---|---|---|---|
| 10,061,150 B2 | 8/2018 | Yamamoto et al. | |
| 10,185,171 B2 | 1/2019 | Ochi et al. | |
| 2010/0271721 A1 | 10/2010 | Gaides et al. | |
| 2018/0113356 A1* | 4/2018 | Lee | G02F 1/1393 |
| 2018/0197921 A1* | 7/2018 | Kim | H10K 50/865 |
| 2018/0331326 A1 | 11/2018 | Woo et al. | |
| 2019/0121176 A1 | 4/2019 | Lee et al. | |
| 2019/0207155 A1* | 7/2019 | Lee | H10K 50/844 |
| 2019/0252365 A1 | 8/2019 | Chen et al. | |
| 2019/0361555 A1* | 11/2019 | Lee | G02F 1/133528 |
| 2019/0371234 A1 | 12/2019 | Matsueda | |

FOREIGN PATENT DOCUMENTS

| | | |
|---|---|---|
| KR | 1020180004380 A | 1/2018 |
| KR | 10-1830612 | 2/2018 |
| KR | 10-2018-0084333 | 7/2018 |
| KR | 1020180125674 A | 11/2018 |
| KR | 1020190007981 A | 1/2019 |
| KR | 10-2019-0044902 | 5/2019 |
| KR | 10-2019-0054484 | 5/2019 |
| KR | 1020190047592 A | 5/2019 |
| KR | 1020190119697 A | 10/2019 |

OTHER PUBLICATIONS

Notice of Allowance dated Mar. 29, 2023, issued to U.S. Appl. No. 17/141,222.

* cited by examiner

DISPLAY DEVICE HAVING A TRANSPARENT MASK THAT INCLUDES A TRANSPARENT OXIDE

CROSS-REFERENCE TO RELATED APPLICATIONS

This application is a Continuation of U.S. patent application Ser. No. 17/141,222, filed on Jan. 5, 2021, which claims priority from and the benefit of Korean Patent Application No. 10-2020-0005206 filed on Jan. 15, 2020, each of which is hereby incorporated by reference for all purposes as if fully set forth herein.

BACKGROUND

Field

Exemplary embodiments of the invention relate generally to a display device and, more specifically, to the display device that can minimize a decrease in luminance of a display panel.

Discussion of the Background

As the information society develops, the demand for display devices for displaying images has increased and diversified. For example, display devices have been applied to various electronic devices such as smartphones, digital cameras, laptop computers, navigation devices, and smart televisions.

The display device may be applied to a center information display (CID) disposed on an instrument panel, a center fascia, or a dashboard of a vehicle. Such a display device may secure a viewing angle by using viewing angle technology but may use a film for limiting a light exit angle for reasons of security or to prevent ghost images, if necessary. A conventional display device has, for example, the following problems. In a process of limiting the light exit angle of a display panel, an aperture ratio of the display panel may be reduced, and the luminance of the display panel may decrease. Accordingly, in order to achieve high luminance, power consumption may increase. Also, as power consumption increases, the lifetime of the device decreases.

The above information disclosed in this Background section is only for understanding of the background of the inventive concepts, and, therefore, it may contain information that does not constitute prior art.

SUMMARY

One or more exemplary embodiments of the inventive concepts provide a display device capable of minimizing a decrease in luminance of a display panel while controlling a viewing angle by limiting a light exit angle of each of a plurality of opening regions using a plurality of light blocking patterns disposed on a light emitting element layer.

One or more exemplary embodiments of the inventive concepts also provide a display device capable of reducing power consumption and minimizing manufacturing costs while minimizing a decrease in luminance of a display panel by internally providing a plurality of light blocking patterns for controlling a viewing angle in the display panel.

Additional features of the inventive concepts will be set forth in the description which follows, and in part will be apparent from the description, or may be learned by practice of the inventive concepts.

According to one or more exemplary embodiments of the invention, a display device includes a plurality of first electrodes electrically connected to pixel circuits disposed on a substrate and a pixel defining layer defining a plurality of opening regions. Each of the opening regions exposes a portion of each of the first electrodes. The display device also includes a plurality of light emitting layers respectively disposed on the first electrodes in the opening regions; a second electrode covering the light emitting layers and the pixel defining layer; an encapsulation layer disposed on the second electrode; and a plurality of light blocking patterns disposed on the encapsulation layer between the opening regions adjacent to each other in a first direction.

According to one or more exemplary embodiments, the display device may further include a light transmissive film disposed on the encapsulation layer so as to overlap the opening regions and surrounding each of the light blocking patterns in plan view; and a transparent mask disposed on the light transmissive film and surrounding each of the light blocking patterns in plan view.

According to one or more exemplary embodiments, each of the light blocking patterns may include a first portion surrounded by the light transmissive film; and a second portion disposed on the first portion and surrounded by the transparent mask.

According to one or more exemplary embodiments, one surface of the second portion may be bent from one surface of the first portion.

According to one or more exemplary embodiments, an upper end of the transparent mask and upper ends of the light blocking patterns may be disposed on the same plane.

According to one or more exemplary embodiments, the transparent mask may include a transparent oxide having dry etching resistance such that an etching rate of the transparent mask is lower than that of the light transmissive film.

According to one or more exemplary embodiments, each of the light blocking patterns and the light transmissive film may be spaced apart from the second electrode with the encapsulation layer interposed therebetween.

According to one or more exemplary embodiments, the light blocking patterns may overlap the pixel defining layer in a thickness direction.

According to one or more exemplary embodiments, a cross-sectional width of each of the light blocking patterns may be smaller than a cross-sectional width of the pixel defining layer.

According to one or more exemplary embodiments, the display device may further include a plurality of unit pixels including first to third sub-pixels, each of the first to third sub-pixels having a first electrode, a light emitting layer and a second electrode disposed in each of the opening regions among the first electrodes, the light emitting layers and the second electrode. A first opening region of the first sub-pixel and a second opening region of the second sub-pixel are disposed on one side of each of the unit pixels, and a third opening region of the third sub-pixel may be disposed on the other side of each of the unit pixels.

According to one or more exemplary embodiments, the display device may further include plurality of spacers disposed on the pixel defining layer between some opening regions among the plurality of opening regions. Each of the spacers may be disposed between the third opening regions adjacent to each other in the first direction.

According to one or more exemplary embodiments, each of the spacers may be disposed between a light blocking pattern disposed above the third opening region of the first unit pixel among the plurality of unit pixels, and a light blocking pattern disposed below the third opening region of the second unit pixel adjacent to the first unit pixel in a second direction perpendicular to the first direction.

According to one or more exemplary embodiments, each of the light blocking patterns may be bent with respect to its center point.

According to one or more exemplary embodiments of the invention, a display device includes a plurality of first electrodes electrically connected to pixel circuits disposed on a substrate; a pixel defining layer defining a plurality of opening regions, each of the opening portions exposing a portion of each of the first electrodes; a plurality of light emitting layers respectively disposed on the first electrodes in the opening regions; a plurality of spacers disposed on the pixel defining layer between some opening regions among the plurality of opening regions; a second electrode covering the light emitting layers, the pixel defining layer and the spacers; an encapsulation layer disposed on the second electrode; and a plurality of light blocking patterns extending in a first direction and spaced apart from each other in a second direction perpendicular to the first direction.

According to one or more exemplary embodiments, the display device may further include a light transmissive film disposed on the encapsulation layer so as to overlap the opening regions and surrounding each of the light blocking patterns in plan view; and a transparent mask disposed on the light transmissive film and surrounding each of the light blocking patterns in plan view.

According to one or more exemplary embodiments, each of the light blocking patterns may include a first portion surrounded by the light transmissive film; and a second portion disposed on the first portion and surrounded by the transparent mask.

According to one or more exemplary embodiments, an upper end of the transparent mask and upper ends of the light blocking patterns may be disposed on the same plane.

According to one or more exemplary embodiments, the display device may further include first to third sub-pixels, each of the first to third sub-pixels having a first electrode, a light emitting layer and a second electrode disposed in each of the opening regions among the first electrodes, the light emitting layers and the second electrode. A first opening region of the first sub-pixel and a second opening region of the second sub-pixel are disposed on one side of each of the unit pixels, and a third opening region of the third sub-pixel may be disposed on the other side of each of the unit pixels.

According to one or more exemplary embodiments, some of the light blocking patterns may overlap the opening regions in a thickness direction, and other ones of the light blocking patterns overlap the pixel defining layer in the thickness direction.

According to one or more exemplary embodiments, the plurality of unit pixels may include unit pixel groups consisting of some unit pixels. The light blocking patterns may be disposed between the unit pixel groups adjacent to each other in the second direction.

According to one or more exemplary embodiments, in a display device a plurality of light blocking patterns may be disposed between a plurality of opening regions adjacent to each other in a first direction on an encapsulation layer. Further, the light blocking patterns include a first portion surrounded by a light transmissive film and a second portion surrounded by a transparent mask and may be formed directly on the encapsulation layer. Therefore, the display device can minimize a decrease in luminance of a display panel while controlling a viewing angle by limiting a light exit angle of each of the opening regions using the light blocking patterns.

According to one or more exemplary embodiments, in the display device the light blocking patterns may extend in a first direction and may be spaced apart from each other in a second direction. The light blocking patterns may overlap the opening regions, or may be disposed between unit pixel groups adjacent to each other. Further, the light blocking patterns include a first portion surrounded by a light transmissive film and a second portion surrounded by a transparent mask and may be formed directly on the encapsulation layer. Therefore, it is possible to reduce power consumption and minimize manufacturing costs while minimizing a decrease in luminance of the display panel by internally providing a plurality of light blocking patterns for controlling a viewing angle in the display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
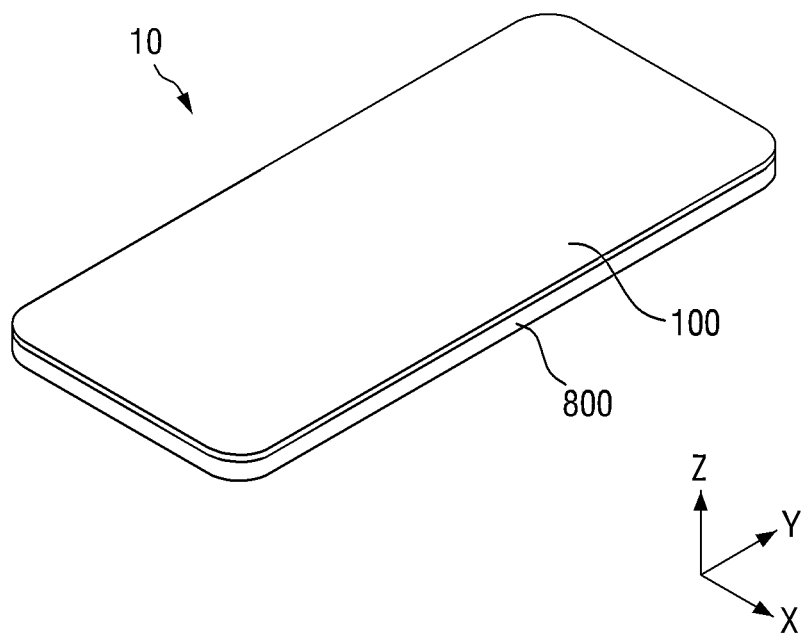
FIG. 1 is a perspective view illustrating a display device according to an embodiment of the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In the accompanying figures, the size and relative sizes of layers, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described with reference to the attached drawings.

Figure 2:
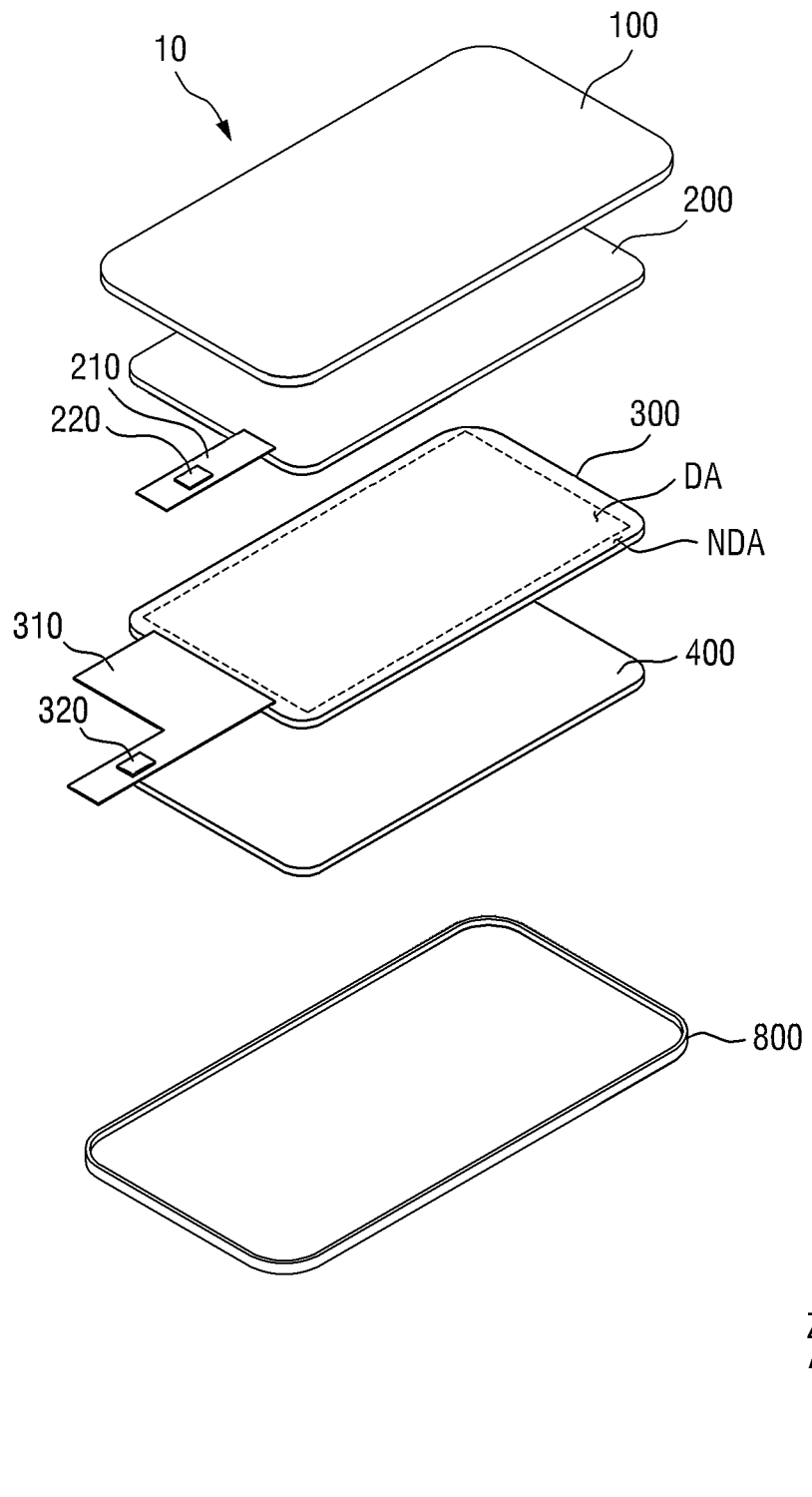
FIG. 2 is an exploded perspective view illustrating the display device of FIG. 1.

FIG. 1 is a perspective view illustrating a display device according to an embodiment. FIG. 2 is an exploded perspective view illustrating the display device of FIG. 1.

The terms "above," "top" and "upper surface" as used herein refer to an upward direction (i.e., a Z-axis direction) with respect to the display device. The terms "below," "bottom" and "lower surface" as used herein refer to a downward direction (i.e., a direction opposite to the Z-axis direction) with respect to the display device. Further, "left", "right", "upper" and "lower" indicate directions when the display device is viewed from above. For example, "left" refers to a direction opposite to an X-axis direction, "right" refers to the X-axis direction, "upper" refers to a Y-axis direction, and "lower" refers to a direction opposite to the Y-axis direction.

Referring to FIGS. 1 and 2, a display device 10 is a device for displaying a moving image or a still image. The display device may be used as a display screen of various products such as televisions, laptop computers, monitors, billboards and the Internet of Things (IOT) as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs).

The display device 10 may have a rectangular shape in plan view. For example, the display device 10 may have a rectangular shape, in plan view, having short sides in a first direction (X-axis direction) and long sides in a second direction (Y-axis direction). A corner where the short side in the first direction (X-axis direction) and the long side in the second direction (Y-axis direction) meet may be right-angled or rounded with a predetermined curvature. The planar shape of the display device 10 is not limited to a rectangular shape, and may be formed in other polygonal shapes, a circular shape, or elliptical shape. For example, the display device 10 may be formed to be flat but is not limited thereto. As another example, the display device 10 may be formed to be bent with a predetermined curvature.

The display device 10 may include a cover window 100, a touch sensing device 200, a display panel 300, a panel bottom member 400, and a bottom cover 800.

The cover window 100 may be disposed above the display panel 300 to cover the top surface of the display panel 300. The cover window 100 may protect the top surface of the display panel 300. For example, the cover window 100 may be attached to the touch sensing device 200 through an adhesive member. The adhesive member may be an optically clear adhesive (OCA) or an optically clear resin (OCR).

The cover window 100 may include a transmission part which displays an image of the display panel 300, and a light blocking part which corresponds to a region other than the transmission part. The light blocking part of the cover window 100 may be formed to be opaque such that unnecessary components other than an image of the display panel 300 cannot be viewed by a user. Alternatively, the light blocking part of the cover window 100 may be formed as a decorative layer having a pattern that is shown to the user when an image is not displayed. For example, the light blocking part of the cover window 100 may include a company's logo or a pattern of various characters.

For example, the cover window 100 may be made of glass, sapphire, or plastic, but is not necessarily limited thereto. The cover window 100 may be rigid or flexible.

The touch sensing device 200 may be disposed between the cover window 100 and the display panel 300. The touch sensing device 200 may detect the user's touch position and may be implemented as an infrared type or a capacitance type such as a self-capacitance type or a mutual capacitance type.

The touch sensing device 200 may be disposed on an upper substrate of the display panel 300. Alternatively, the touch sensing device 200 may be formed integrally with the display panel 300. In this case, the upper substrate of the display panel 300 may be omitted, and the touch sensing device 200 may be formed on an encapsulation layer of the display panel 300. For example, the touch sensing device 200 may further include a pressure sensor capable of sensing the user's pressure.

For example, the display device 10 may further include a polarizing film disposed on the touch sensing device 200 in order to prevent a decrease in visibility of the image displayed by the display panel 300 due to external light reflected by the lines of the touch sensing device 200 or the lines of the display panel 300.

The touch sensing device 200 may include a touch circuit board 210 and a touch driver 220.

The touch circuit board 210 may be disposed on one side of the touch sensing device 200. For example, the touch circuit board 210 may be attached onto pads provided on one side of the touch sensing device 200 using an anisotropic conductive film. The touch circuit board 210 may include a touch connection terminal, and the touch connection terminal may be connected to a connector of the display circuit board 310. The touch circuit board 210 may be a flexible printed circuit board or a chip on film.

The touch driver 220 may apply touch driving signals to the touch sensing device 200, receive sensing signals from the touch sensing device 200, and analyze the sensing signals to calculate the user's touch position. The touch driver 220 may be formed as an integrated circuit and mounted on the touch circuit board 210.

The display panel 300 may include a display circuit board 310 and a display driver 320.

The display circuit board 310 may be attached to one side of the display panel 300. For example, one end of the display circuit board 310 may be attached onto pads provided on one side of the display panel 300 using an anisotropic conductive film. The other end of the display circuit board 310 may be attached on the bottom of the panel bottom member 400 using an adhesive member. The touch circuit board 210 and the display circuit board 310 may be flexible printed circuit boards and may be bent from the top to the bottom of the display panel 300. The display circuit board 310 may be connected to the touch connection terminal of the touch circuit board 210 through a connector.

The display driver 320 may supply signals and voltages for driving the display panel 300 through the display circuit board 310. For example, the display driver 320 may receive digital video data and timing signals from the outside, convert the digital video data into analog positive/negative data voltages, and supply them to data lines through the pads. The display driver 320 may supply a scan control signal for controlling the scan driver through scan control lines. In addition, the display driver 320 may supply source voltages necessary for driving sub-pixels of the display panel 300 to the pads.

The display driver 320 may be formed as an integrated circuit and mounted on the display circuit board 310, but the present disclosure is not limited thereto. For example, the display driver 320 may be attached to one side of the display panel 300.

The panel bottom member 400 may be disposed on the bottom of the display panel 300. For example, the panel bottom member 400 may include at least one of a heat dissipation layer for efficiently dissipating heat of the display panel 300, an electromagnetic shielding layer for shielding electromagnetic waves, a light blocking layer for blocking light incident from the outside, or a buffer layer for absorbing shock from the outside.

The bottom cover 800 may be disposed below the panel bottom member 400. The bottom cover 800 may form an external appearance of the bottom surface of the display device 10. The bottom cover 800 may be formed in a bowl shape to accommodate the display panel 300. The sidewalls of the bottom cover 800 may be in contact with edges of the cover window 100. In this case, the sidewalls of the bottom cover 800 may be bonded to the edges of the cover window 100 through an adhesive member.

The bottom cover 800 may be fastened to the panel bottom member 400 through a fixing member such as a screw or attached to the panel bottom member 400 through an adhesive member such as an adhesive or an adhesive tape. The bottom cover 800 may include plastic and/or metal. The bottom cover 800 may include stainless steel (SUS) or aluminum (Al) to increase a heat dissipation effect.

Figure 3:
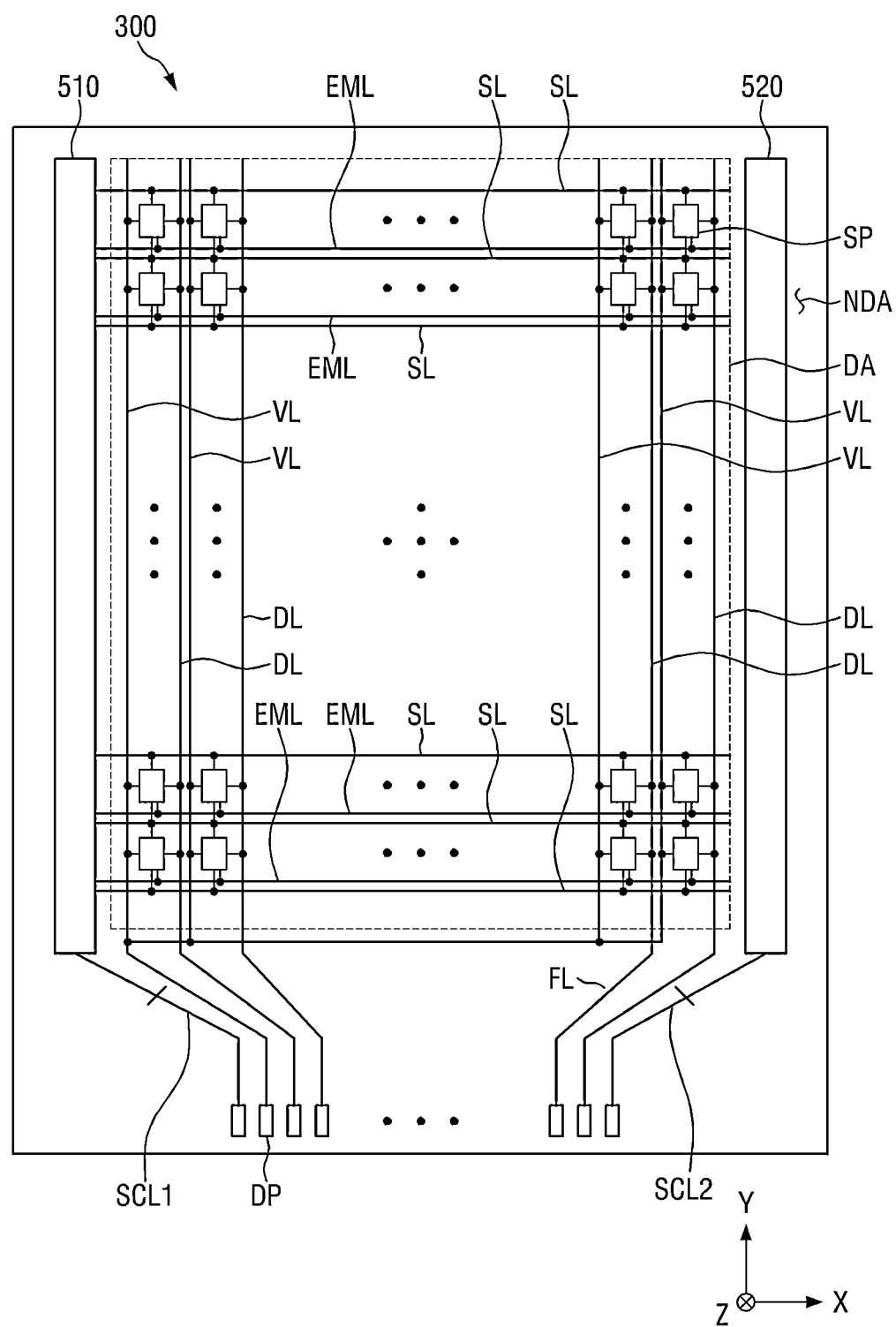
FIG. 3 is a plan view illustrating the display panel of FIG. 2.
Figure 4:
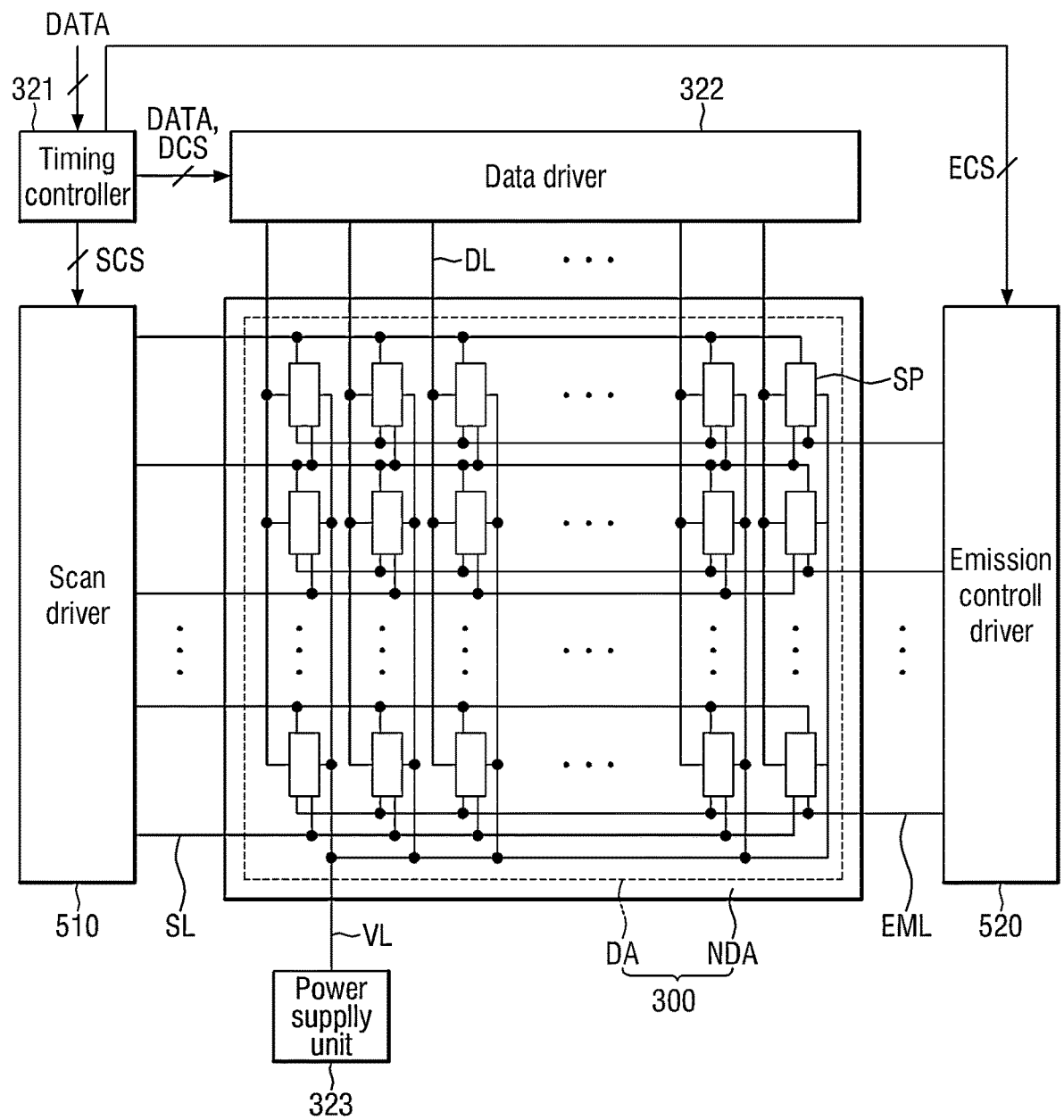
FIG. 4 is a block diagram illustrating the display panel of FIG. 2.

FIG. 3 is a plan view illustrating the display panel of FIG. 2. FIG. 4 is a block diagram illustrating the display panel of FIG. 2.

Referring to FIGS. 3 and 4, the display panel 300 may include a display area DA in which sub-pixels SP are formed to display an image, and a non-display area NDA which is a peripheral area of the display area DA. The display area DA may include the sub-pixels SP, scan lines SL connected to the sub-pixels SP, emission control lines EML, data lines DL, and voltage supply lines VL. The scan lines SL and the emission control lines EML are formed in parallel in the first direction (X-axis direction). The data lines DL and the voltage supply lines VL may be formed in parallel in the second direction (Y-axis direction) crossing the first direction (X-axis direction).

Each of the sub-pixels SP may be connected to at least one of the scan lines SL, at least one of the data lines DL, at least one of the emission control lines EML, and at least one of the voltage supply lines VL. In FIG. 3, each of the sub-pixels SP may be connected to two scan lines SL, one data line DL, one emission control line EML, and one voltage supply line VL, but the present disclosure is not limited thereto. In another example, each of the sub-pixels SP may be connected to three scan lines SL.

Each of the sub-pixels SP may include a driving transistor, at least one switching transistor, a light emitting element, and at least one capacitor. The switching transistor may be turned on when a scan signal is applied from the scan line SL, and thus a data voltage of the data line DL may be applied to a gate electrode of the driving transistor. The driving transistor may supply a driving current to the light emitting element according to the data voltage applied to the gate electrode, and the light emitting element may emit light having a predetermined luminance according to the magnitude of the driving current. For example, the driving transistor and at least one switching transistor may be thin film transistors. The light emitting element may be an organic light emitting diode including a first electrode, an organic light emitting layer and a second electrode. The capacitor may keep constant the data voltage applied to the gate electrode of the driving transistor.

The non-display area NDA may be defined as an area from the outside of the display area DA to the edges of the display panel 300. The non-display area NDA may include a scan driver 510 for applying scan signals to the scan lines SL, an emission control driver 520 for applying emission signals to the emission control lines EML, fan-out lines FL between the data lines DL and pads DP, and the pads DP connected to the display driver 320. For example, the pads DP may be disposed on one side edge of the display panel 300.

The display panel 300 may include the scan driver 510 and the emission control driver 520.

The scan driver 510 may generate scan signals based on a scan control signal SCS and sequentially output the scan signals to the scan lines SL. The emission control driver 520 may generate emission signals according to an emission control signal ECS, and sequentially output the emission signals to the emission control lines EML.

Each of the scan driver 510 and the emission control driver 520 may include a plurality of thin film transistors. The scan driver 510 and the emission control driver 520 may be formed on the same layer as the thin film transistors of the sub-pixels SP. In FIG. 3, the scan driver 510 may be disposed on the left side of the non-display area NDA, and the emission control driver 520 may be disposed on the right side of the non-display area NDA, but the present disclosure is not limited thereto.

In FIG. 4, the display driver 320 may include a timing controller 321, a data driver 322, and a power supply unit 323.

The timing controller 321 may receive digital video data DATA and timing signals from the display circuit board 310 of FIG. 2. The timing controller 321 may generate a data control signal DCS for controlling an operation timing of the data driver 322 based on the timing signals, generate a scan control signal SCS for controlling an operation timing of the scan driver 510, and generate an emission control signal ECS for controlling an operation timing of the emission control driver 520. The timing controller 321 may supply the digital video data DATA and the data control signal DCS to the data driver 322. The timing controller 321 may supply the scan control signal SCS to the scan driver 510 through a plurality of first scan control lines SCL1 and supply the emission control signal ECS to the emission control driver 520 through the plurality of second scan control lines SCL2.

The data driver 322 may convert the digital video data DATA into analog positive/negative data voltages and supply them to the data lines DL through the fan-out lines FL. The scan signals of the scan driver 510 may select the sub-pixels SP to be supplied with the data voltages, and the data driver 322 may supply data voltages to the selected sub-pixels SP.

The power supply unit 323 may generate a first driving voltage and supply the first driving voltage to the voltage supply line VL. The power supply unit 323 may generate a second driving voltage and supply the second driving voltage to the second electrode (or a cathode electrode) of the light emitting element of each of the sub-pixels SP. Here, the first driving voltage may be a high potential voltage for driving the light emitting element, and the second driving voltage may be a low potential voltage for driving the light emitting element. For example, the first driving voltage may have a higher potential than the second driving voltage.

Figure 5:
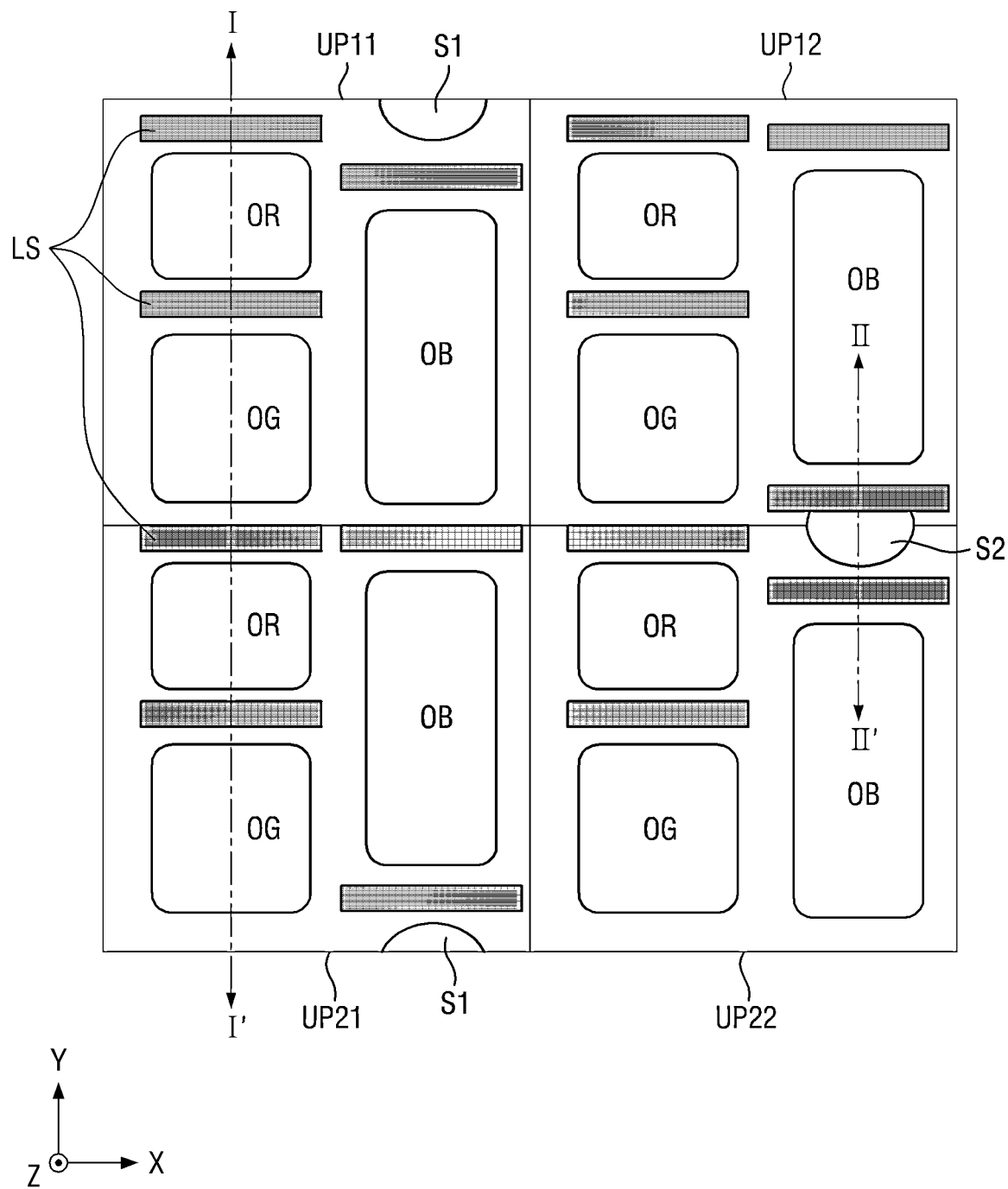
FIG. 5 is a plan view illustrating a plurality of unit pixels of a display device according to an embodiment of the inventive concepts.

FIG. 5 is a plan view illustrating a plurality of unit pixels of a display device according to an embodiment.

Referring to FIG. 5, the display area DA of the display panel 300 may include a plurality of unit pixels. For example, the plurality of unit pixels may include a first-first unit pixel UP11 to a second-second unit pixel UP22 arranged in two rows and two columns. The display area DA may include more unit pixels as the resolution of the display device 10 increases. Accordingly, the display area DA may include a plurality of unit pixels arranged in p rows and q columns (p and q are natural numbers) according to the resolution of the display device 10.

Each of the first-first unit pixel UP11 to the second-second unit pixel UP22 may include a plurality of sub-pixels displaying different colors. The plurality of sub-pixels may be provided by intersections of n data lines DL (n is a natural number) and m scan lines SL (m is a natural number). One unit pixel may accommodate a pixel circuit of each of the plurality of sub-pixels. The pixel circuit may include a driving transistor, at least one switching transistor, and at least one capacitor to drive a light emitting element of each of the plurality of sub-pixels.

For example, one unit pixel may include a red sub-pixel, a green sub-pixel, and a blue sub-pixel. Each of the red sub-pixel, the green sub-pixel, and the blue sub-pixel may receive a data signal including gradation information of red, green, or blue light from the data driver 322 and output light of a corresponding color.

Each of the first-first unit pixel UP11 to the second-second unit pixel UP22 may include first to third sub-pixels. For example, the first sub-pixel may be a red sub-pixel, the second sub-pixel may be a green sub-pixel, and the third sub-pixel may be a blue sub-pixel, but the present disclosure is not limited thereto.

The first sub-pixel may include a first opening region OR, the second sub-pixel may include a second opening region OG, and the third sub-pixel may include a third opening region OB. The first to third opening regions OR, OG and OB may be defined by a pixel defining layer. A light emitting element of each of the first to third sub-pixels may be disposed in each of the first to third opening regions OR, OG and OB to emit light of a specific wavelength band. The size of each of the first to third opening regions OR, OG and OB may be adjusted to realize white light by mixing light emitted from each of a plurality of light emitting elements. The first to third sub-pixels may have opening regions of different sizes to realize white light. For example, the size of the third opening region OB may be larger than that of the first or second opening region OR or OG but is not necessarily limited thereto.

The first opening region OR and the second opening region OG of each of the plurality of unit pixels may be disposed on one side of each of the plurality of unit pixels. The third opening region OB of each of the plurality of unit pixels may be disposed on the other side of each of the plurality of unit pixels. For example, the first opening region OR may be disposed on the upper left side of each of the plurality of unit pixels, and the second opening region OG may be disposed on the lower left side of each of the plurality of unit pixels. The third opening region OB may be disposed on the right side of each of the plurality of unit pixels. The upper side of the third opening region OB may face the first opening region OR, and the lower side of the third opening region OB may face the second opening region OG.

The display panel 300 may include a plurality of light blocking patterns LS disposed between the plurality of opening regions, extending in the first direction (X-axis direction) and spaced apart from each other in the second direction (Y-axis direction) perpendicular to the first direction. Each of the light blocking patterns LS may be disposed to be parallel to one side of each of the first to third opening regions OR, OG and OB. For example, each of the plurality of light blocking patterns LS may be disposed on the upper side of each of the first to third opening regions OR, OG and OB to block light emitted to the upper side of the display panel 300 from the first to third openings OR, OG and OB. In addition, the plurality of light blocking patterns LS do not overlap the first to third opening regions OR, OG and OB, and do not block light emitted to the left side or the right side of the first to third opening regions OR, OG and OB while blocking light emitted to the upper side or the lower side of the first to third opening regions OR, OG and OB, thereby minimizing a reduction in luminance of the display panel 300. Accordingly, the plurality of light blocking patterns LS may limit a light exit angle of each of the first to third opening regions OR, OG and OB, and minimize a reduction in luminance of the display panel 300 while controlling a viewing angle.

Each of the light blocking patterns LS may be disposed between the first, second and third openings OR, OG and OB adjacent in the second direction (Y-axis direction). For example, some of the plurality of light blocking patterns LS may be disposed between the first opening region OR and the second opening region OG adjacent in the second direction (Y-axis direction), thereby blocking light emitted to the upper or lower side of the display panel 300 from the first opening region OR or the second opening region OG. The other ones of the plurality of light blocking patterns LS may be disposed between the third opening regions OB adjacent in the second direction (Y-axis direction), thereby blocking light emitted to the upper or lower side of the display panel 300 from the third opening region OB.

For example, the length of the plurality of light blocking patterns LS in the first direction (X-axis direction) may correspond to the length of each of the first to third opening regions OR, OG and OB in the first direction (X-axis direction), but the present disclosure is not limited thereto.

The display panel 300 may include a plurality of spacers disposed between some opening regions of the plurality of opening regions. For example, the display panel 300 may include a plurality of first spacers S1, each disposed on the upper side of the third opening region OB of the first-first unit pixel UP11, and a plurality of second spacers S2, each disposed between the third opening region OB of the first-second unit pixel UP12 and the third opening region OB of the second-second unit pixel UP22. The plurality of first and second spacers S1 and S2 may alleviate the shock transmitted to the plurality of unit pixels and improve the durability of the plurality of unit pixels.

Each of the plurality of second spacers S2 may be disposed between the light blocking pattern LS disposed on the upper side of the third opening region OB of the first unit pixel among the plurality of unit pixels and the light blocking pattern LS disposed on the lower side of the third opening region OB of the second unit pixel adjacent to the first unit pixel in the second direction (Y-axis direction). For example, each of the plurality of second spacers S2 may be disposed between the light blocking pattern LS disposed on the upper side of the third opening region OB of the second-second unit pixel UP22 and the light blocking pattern LS disposed on the lower side of the third opening region OB of the first-second unit pixel UP12 adjacent to the second-second unit pixel UP22 in the second direction (Y-axis direction). Further, the plurality of second spacers S2 may overlap some of the plurality of light blocking patterns LS in the thickness direction. The plurality of light blocking patterns LS and the plurality of second spacers S2 may be disposed between the third opening region OB of the first-second unit pixel UP12 and the third opening region of the second-second unit pixel UP22, thereby minimizing a decrease in luminance of the display panel 300. Therefore, the display device 10 can control the viewing angle using the plurality of light blocking patterns LS while minimizing a decrease in luminance of the display panel 300 and reducing power consumption.

Figure 6:
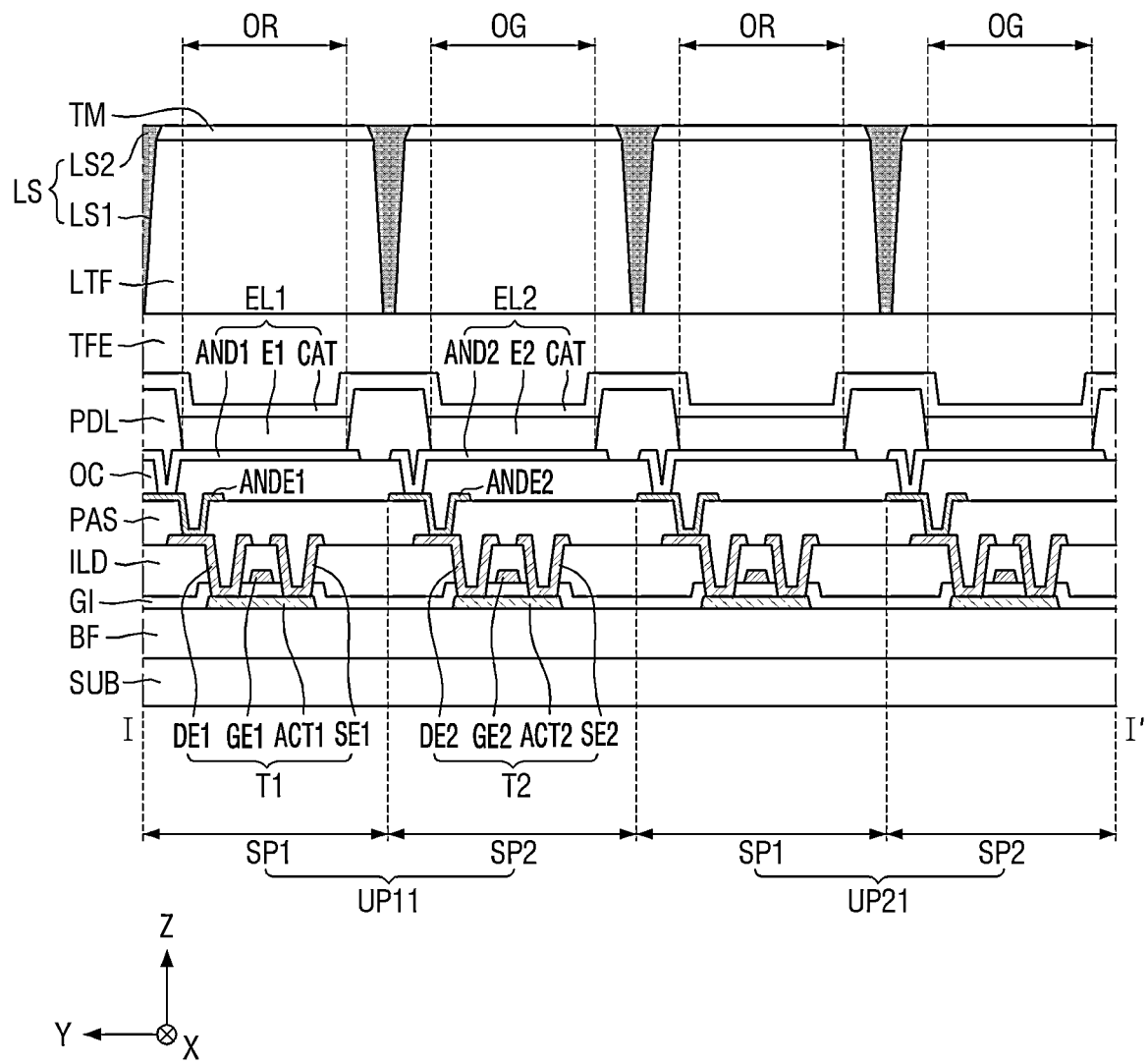
FIG. 6 is a cross-sectional view taken along line I-I' of FIG. 5.
Figure 7:
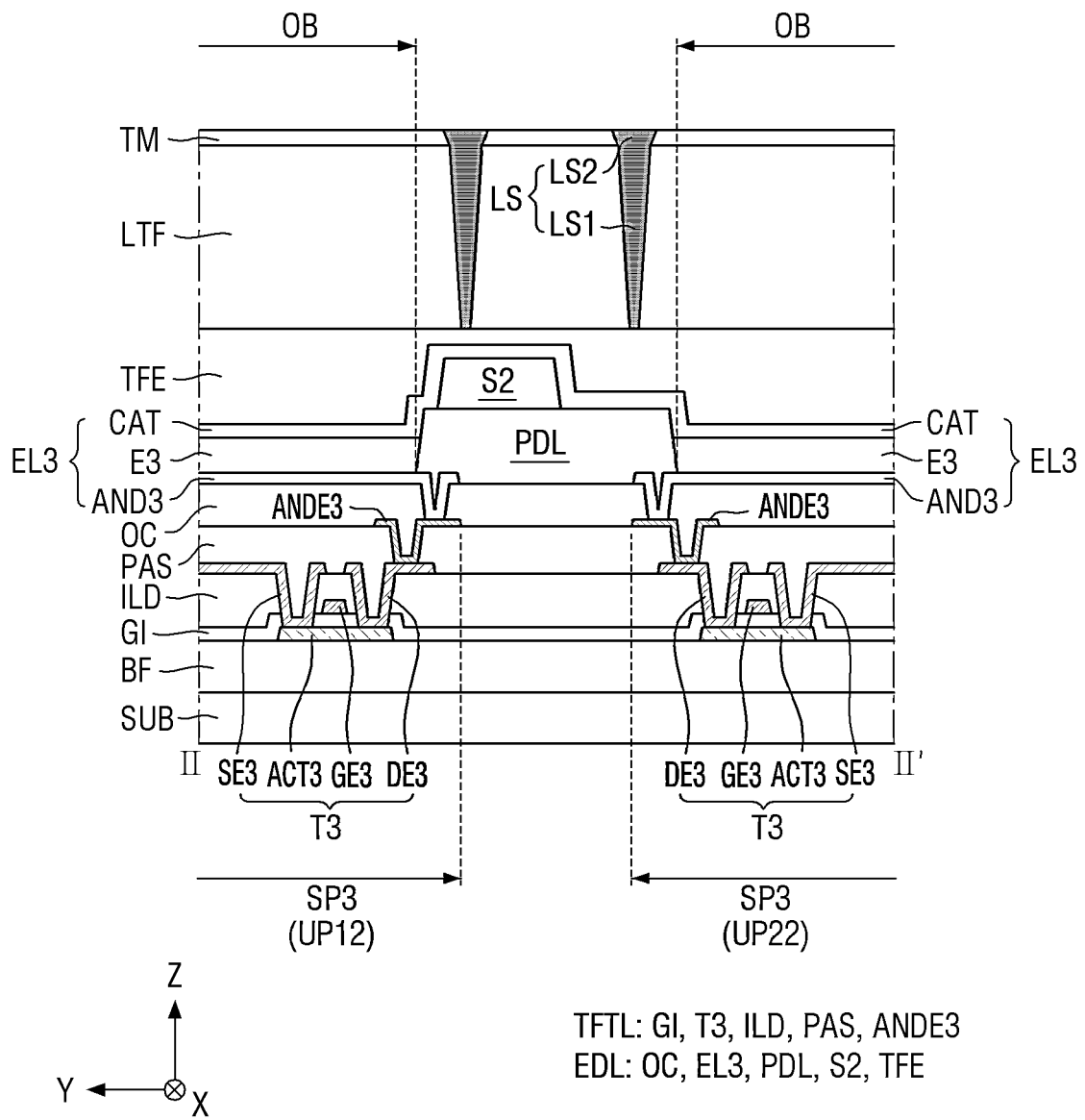
FIG. 7 is a cross-sectional view taken along line II-IT of FIG. 5.

FIG. 6 is a cross-sectional view taken along line I-I' of FIG. 5. FIG. 7 is a cross-sectional view taken along line II-II' of FIG. 5.

Referring to FIGS. 6 and 7, the display panel 300 may include a substrate SUB, a buffer layer BF, a thin film transistor layer TFTL, a light emitting element layer EDL, a light transmissive film LTF, and a transparent mask TM, and a plurality of light blocking patterns LS.

The substrate SUB may be a base substrate and may be made of an insulating material such as polymer resin. For example, the substrate SUB may be a rigid substrate. In another example, the substrate SUB may be a flexible substrate which can be bent, folded or rolled. When the substrate SUB is a flexible substrate, the substrate SUB may be formed of polyimide (PI) but is not necessarily limited thereto.

The buffer layer BF may be disposed on the substrate SUB. The buffer layer BF may be formed of an inorganic layer that can prevent infiltration of air or moisture. For example, the buffer layer BF may include a plurality of inorganic layers that are alternately stacked. The buffer layer BF may be formed of multiple layers in which one or more inorganic layers of a silicon nitride layer, a silicon oxynitride layer, a silicon oxide layer, a titanium oxide layer and an aluminum oxide layer are alternately stacked but is not necessarily limited thereto.

The thin film transistor layer TFTL may include first to third transistors T1, T2 and T3, a gate insulating layer GI, an interlayer insulating layer ILD, a passivation layer PAS, and first to third anode connection electrodes ANDE1, ANDE2 and ANDE3.

The first transistor T1 may be disposed on the buffer layer BF and may constitute the pixel circuit of the first sub-pixel. For example, the first transistor T1 may be a driving transistor or a switching transistor of the first sub-pixel. The first transistor T1 may include a semiconductor layer ACT1, a gate electrode GE1, a source electrode SE1, and a drain electrode DE1.

The semiconductor layer ACT1 may be provided on the buffer layer BF. The semiconductor layer ACT1 may overlap the gate electrode GE1, the source electrode SE1, and the drain electrode DE1. The semiconductor layer ACT1 may be in direct contact with the source electrode SE1 and the drain electrode DE1 and may face the gate electrode GE1 with the gate insulating layer GI interposed therebetween.

The gate electrode GE1 may be disposed on the gate insulating layer GI. The gate electrode GE1 may overlap the semiconductor layer ACT1 with the gate insulating layer GI interposed therebetween.

The source electrode SE1 and the drain electrode DE1 may be spaced apart from each other on the interlayer insulating layer ILD. The source electrode SE1 may be in contact with one end of the semiconductor layer ACT1 through a contact hole provided in the gate insulating layer GI and the interlayer insulating layer ILD. The drain electrode DE1 may be in contact with the other end of the semiconductor layer ACT1 through a contact hole provided in the gate insulating layer GI and the interlayer insulating layer ILD. The drain electrode DE1 may be connected to a first electrode AND1 of a first light emitting element EL1 through the first anode connection electrode ANDE1.

The second transistor T2 may be disposed on the buffer layer BF and may constitute the pixel circuit of the second sub-pixel. For example, the second transistor T2 may be a driving transistor or a switching transistor of the second sub-pixel. The second transistor T2 may include a semiconductor layer ACT2, a gate electrode GE2, a source electrode SE2, and a drain electrode DE2. The drain electrode DE2 of the second transistor T2 may be connected to a first electrode AND2 of a second light emitting element EL2 through the second anode connection electrode ANDE2.

The third transistor T3 may be disposed on the buffer layer BF and may constitute the pixel circuit of the third sub-pixel. For example, the third transistor T3 may be a driving transistor or a switching transistor of the third sub-pixel. The third transistor T3 may include a semiconductor layer ACT3, a gate electrode GE3, a source electrode SE3, and a drain electrode DE3. The drain electrode DE3 of the third transistor T3 may be connected to a first electrode AND3 of a third light emitting element EL3 through the third anode connection electrode ANDE3.

The gate insulating layer GI may be provided on the semiconductor layers ACT1, ACT2 and ACT3. For example, the gate insulating layer GI may be disposed on the semiconductor layers ACT1, ACT2 and ACT3 and the buffer layer BF, and may insulate the semiconductor layers ACT1, ACT2 and ACT3 from the gate electrodes GE1, GE2 and GE3. The gate insulating layer GI may include contact holes through which the source electrodes SE1, SE2 and SE3 pass, and contact holes through which the drain electrodes DE1, DE2, and DE3 pass.

The interlayer insulating layer ILD may be disposed on the gate electrodes GE1, GE2 and GE3. For example, the interlayer insulating layer ILD may include contact holes through which the source electrodes SE1, SE2 and SE3 pass, and contact holes through which the drain electrodes DE1, DE2 and DE3 pass. The contact holes of the interlayer insulating layer ILD may be connected to the contact holes of the gate insulating layer GI.

The passivation layer PAS may be provided on the first to third transistors T1, T2 and T3 to protect the first to third transistors T1, T2 and T3. For example, the passivation layer PAS may include contact holes through which the first to third anode connection electrodes ANDE1, ANDE2 and ANDE3 pass.

The light emitting element layer EDL may include a planarization layer OC, first to third light emitting elements EL1, EL2 and EL3, a pixel defining layer PDL, a plurality of first and second spacers S1 and S2, and an encapsulation layer TFE.

The planarization layer OC may be provided on the passivation layer PAS to planarize the upper ends of the first to third transistors T1, T2 and T3. For example, the planarization layer OC may include contact holes through which the first electrodes AND1, AND2 and AND3 of the first to third light emitting elements EL1, EL2 and EL3 pass.

The first light emitting element EL1 may be provided on the first transistor T1. The first light emitting element EL1 may include a first electrode AND1, a light emitting layer E1, and a second electrode CAT.

The first electrode AND1 may be provided on the planarization layer OC. For example, the first electrode AND1 may be disposed to overlap the first opening region OR defined by the pixel defining layer PDL. The first electrode AND1 may be connected to the drain electrode DE1 of the first transistor T1 through the first anode connection electrode ANDE1.

The light emitting layer E1 may be provided on the first electrode AND1. The light emitting layer E1 may include a hole injection layer, a hole transport layer, a light receiving layer, an electron blocking layer, an electron transport layer, an electron injection layer, and the like. For example, the light emitting layer E1 may be an organic light emitting layer made of an organic material but is not necessarily limited thereto. In a case where the light emitting layer E1 is an organic light emitting layer, when the first transistor T1 applies a predetermined voltage to the first electrode AND1 of the first light emitting element EL1 and the second electrode CAT of the first light emitting element EL1 receives a common voltage or a cathode voltage, each of the holes and the electrons may move to the organic light emitting layer E1 through the hole transport layer and the electron transport layer, and the holes and the electrons may combine with each other in the organic light emitting layer E1 to emit light.

The second electrode CAT may be provided on the light emitting layer E1. For example, the second electrode CAT may be implemented as an electrode common to all the sub-pixels SP without distinction for each sub-pixel SP. In FIGS. 6 and 7, the second electrode CAT may be disposed on the light emitting layers E1, E2 and E3 in the opening regions OR, OG and OB, and may be disposed on the pixel defining layer PDL or the second spacer S2 in a non-opening region.

The second light emitting element EL2 may be provided on the second transistor T2. The second light emitting element EL2 may include a first electrode AND2, a light emitting layer E2, and a second electrode CAT.

The first electrode AND2 may be provided on the planarization layer OC. For example, the first electrode AND2 may be disposed to overlap the second opening region OG defined by the pixel defining layer PDL. The first electrode AND2 may be connected to the drain electrode DE2 of the second transistor T2 through the second anode connection electrode ANDE2. The light emitting layer E2 may be provided on the first electrode AND2, and the second electrode CAT may be provided on the light emitting layer E2.

The third light emitting element EL3 may be provided on the third transistor T3. The third light emitting element EL3 may include a first electrode AND3, a light emitting layer E3, and a second electrode CAT.

The first electrode AND3 may be provided on the planarization layer OC. For example, the first electrode AND3 may be disposed to overlap the third opening region OB defined by the pixel defining layer PDL. The first electrode AND3 may be connected to the drain electrode DE3 of the third transistor T3 through the third anode connection electrode ANDE3. The light emitting layer E3 may be provided on the first electrode AND3, and the second electrode CAT may be provided on the light emitting layer E3.

The pixel defining layer PDL may define first to third opening regions OR, OG and OB. The pixel defining layer PDL may separate and insulate the first electrodes AND1, AND2 and AND3 of the first to third light emitting elements EL1, EL2 and EL3, respectively.

For example, the pixel defining layer PDL may include a light absorbing material such as a black pigment or a black dye that absorbs light. The pixel defining layer PDL includes a light absorbing material, thereby minimizing external light reflected at the boundary of the opening region.

The first spacer S1 and the second spacer S2 may be disposed on the pixel defining layer PDL. The first and second spacers S1 and S2 may maintain a constant distance between the substrate SUB of the display panel 300 and the transparent mask TM. The first and second spacers S1 and S2 may alleviate the shock transmission between the substrate SUB and the transparent mask TM. For example, the first and second spacers S1 and S2 may include a material having excellent shock absorbency and flexibility to improve the durability of the display device 10.

The encapsulation layer TFE may be disposed on the second electrode CAT to cover the first to third light emitting elements EL1, EL2 and EL3. The encapsulation layer TFE may prevent oxygen or moisture from infiltrating into the first to third light emitting elements EL1, EL2 and EL3.

The light transmissive film LTF may be disposed to overlap the plurality of opening regions on the encapsulation layer TFE and may surround each of the plurality of light blocking patterns LS in plan view. The light transmissive film LTF may be spaced apart from the second electrode CAT with the encapsulation layer TFE interposed therebetween. For example, the light transmissive film LTF may be implemented as an organic film including at least one of polyimide-based resin, acryl-based resin, or siloxane-based resin. The light transmissive film LTF may transmit light emitted from each of the first to third opening regions OR, OG and OB. The light transmissive film LTF may be patterned according to the shape of the transparent mask TM. The patterned light transmissive film LTF may surround a first portion LS1 of the light blocking pattern LS in plan view and determine the pattern of the light blocking pattern LS. The light transmissive layer LTF may serve as a mold to determine the pattern of the light blocking pattern LS in a process of forming the light blocking pattern LS.

The transparent mask TM may be disposed to overlap the plurality of opening regions on the light transmissive film LTF and surround the light blocking pattern LS in plan view. In addition to the light transmissive film LTF, the transparent mask TM may transmit light emitted from each of the first to third opening regions OR, OG and OB. The transparent mask TM may surround a second portion LS2 of the light blocking pattern LS in plan view, and determine the pattern of the light blocking pattern LS. The transparent mask TM may be formed on the light transmissive film LTF before patterning and may act as a mask in an etching process of the light transmissive film LTF. For example, the transparent mask TM may include a transparent oxide having dry etching resistance. For example, an etching rate of the transparent mask TM may be lower than that of the light transmissive film LTF. The transparent mask TM may include indium tin oxide (ITO) or indium zinc oxide (IZO), which is a transparent oxide, but is not limited thereto.

The light blocking patterns LS may be disposed on the encapsulation layer TFE and overlap the pixel defining layer PDL in the thickness direction. Each of the light blocking patterns LS may be spaced apart from the second electrode CAT with the encapsulation layer TFE interposed therebetween. For example, the light blocking patterns LS may include a material (e.g., a black resin or a black matrix material) that absorbs or blocks light.

Each of the plurality of light blocking patterns LS may include the first portion LS1 surrounded by the light transmissive film LTF and the second portion LS2 disposed on the first portion LS1 and surrounded by the transparent mask TM. The side surface of the light transmissive film LTF may face the side surface of the first portion LS1, and the side surface of the transparent mask TM may face the side surface of the second portion LS2. For example, one surface (or side surface) of the second portion LS2 may be bent from one surface (or side surface) of the first portion LS1. The transparent mask TM may be formed on the light transmissive film LTF before patterning, and the light transmissive film LTF may be patterned according to the pattern of the transparent mask TM. Therefore, the transparent mask TM and the light transmissive film LTF may be formed through separate patterning processes, and the side surface of the transparent mask TM and the side surface of the light transmissive film LTF may be shifted from each other.

Upper ends of the plurality of light blocking patterns LS may be disposed on the same plane as the upper end of the transparent mask TM. For example, after the light transmissive film LTF is patterned, the material forming the light blocking patterns LS may fill an empty space surrounded by the light transmissive film LTF and the transparent mask TM, and the material forming the light blocking patterns LS disposed higher than the transparent mask TM may be removed. The upper ends of the light blocking patterns LS may be planarized with respect to the upper end of the transparent mask TM through a polishing process. For example, the upper ends of the light blocking patterns LS may be planarized through a chemical mechanical polishing (CMP) process but are not necessarily limited thereto.

In this manner, the light blocking patterns LS may be fabricated as a separate film from the display panel 300 and may be directly formed on the encapsulation layer TFE of the display panel 300 without being attached to the display panel 300. The light blocking patterns LS may be directly formed on the encapsulation layer TFE without requiring a separate substrate or an adhesive member in a formation process. Since the light blocking patterns LS are disposed between the opening regions so as not to overlap the opening regions, a decrease in luminance of the display panel 300 can be minimized. Therefore, since the display device 10 includes the plurality of light blocking patterns LS, which control the viewing angle and are internally provided in the display panel 300, it is possible to reduce power consumption while minimizing a decrease in luminance of the display panel 300, and also possible to reduce the manufacturing cost while reducing the thickness of the display panel 300.

The height, thickness, shape, and position of each of the light blocking patterns LS may determine the light exit angle of each of the opening regions. For example, as the height of the light blocking pattern LS increases, the light emission angle may be limited. As the thickness of the light blocking pattern LS increases, the luminance of the display panel 300 may decrease. The shape and position of the light blocking pattern LS can prevent the light emitted from the opening regions from traveling in a specific direction. In addition, the cross-sectional width of the light blocking pattern LS may be smaller than the cross-sectional width of the pixel defining layer PDL but is not necessarily limited thereto.

FIGS. 8, 9, 10, and 11 are cross-sectional views illustrating a manufacturing process of a display device according to an embodiment.

Figure 8:
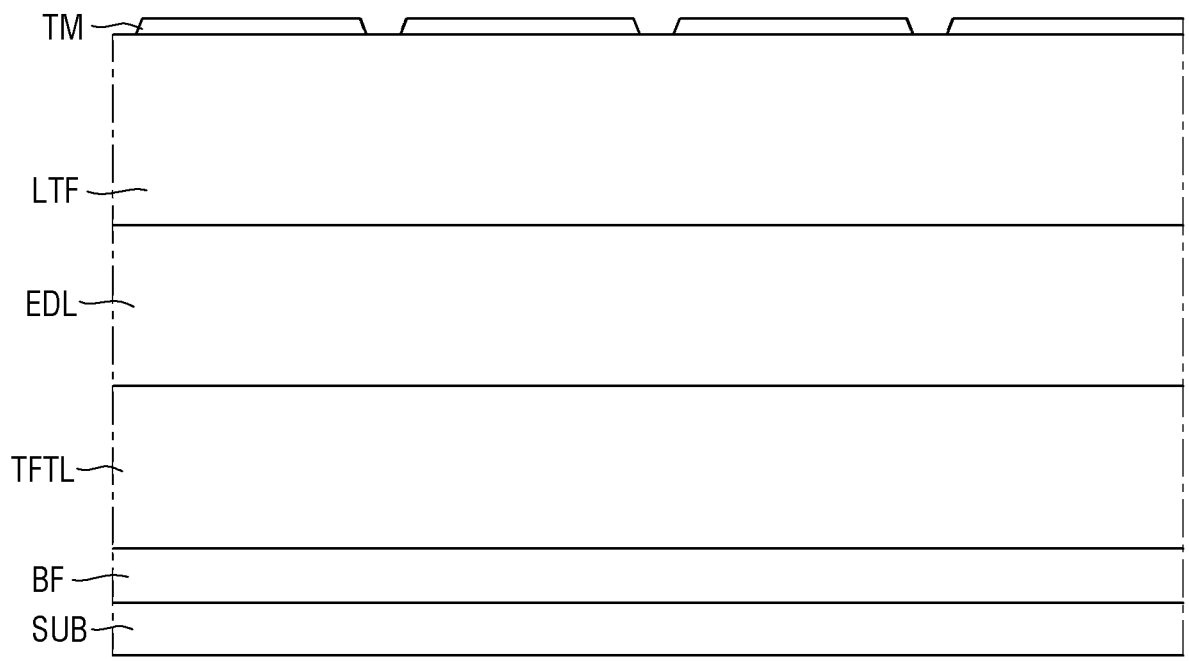
FIGS. 8, 9, 10, and 11 are cross-sectional views illustrating a manufacturing process of a display device according to an embodiment of the inventive concepts.

In FIG. 8, the material forming the light transmissive film LTF may be provided on the encapsulation layer TFE of the light emitting element layer EDL. Here, the thickness of the light transmissive film LTF may be determined according to the height of the light blocking patterns LS to be formed later. For example, the light transmissive film LTF may be implemented as an organic film including at least one of polyimide-based resin, acryl-based resin, or siloxane-based resin.

The transparent mask TM may be disposed to overlap the opening regions on the light transmissive film LTF. The transparent mask TM may be formed on the light transmissive film LTF before patterning and may act as a mask in an etching process of the light transmissive film LTF. For example, the transparent mask TM may include a transparent oxide having dry etching resistance. The transparent mask TM may include indium tin oxide (ITO) or indium zinc oxide (IZO), which is a transparent oxide, but is not limited thereto.

Figure 9:
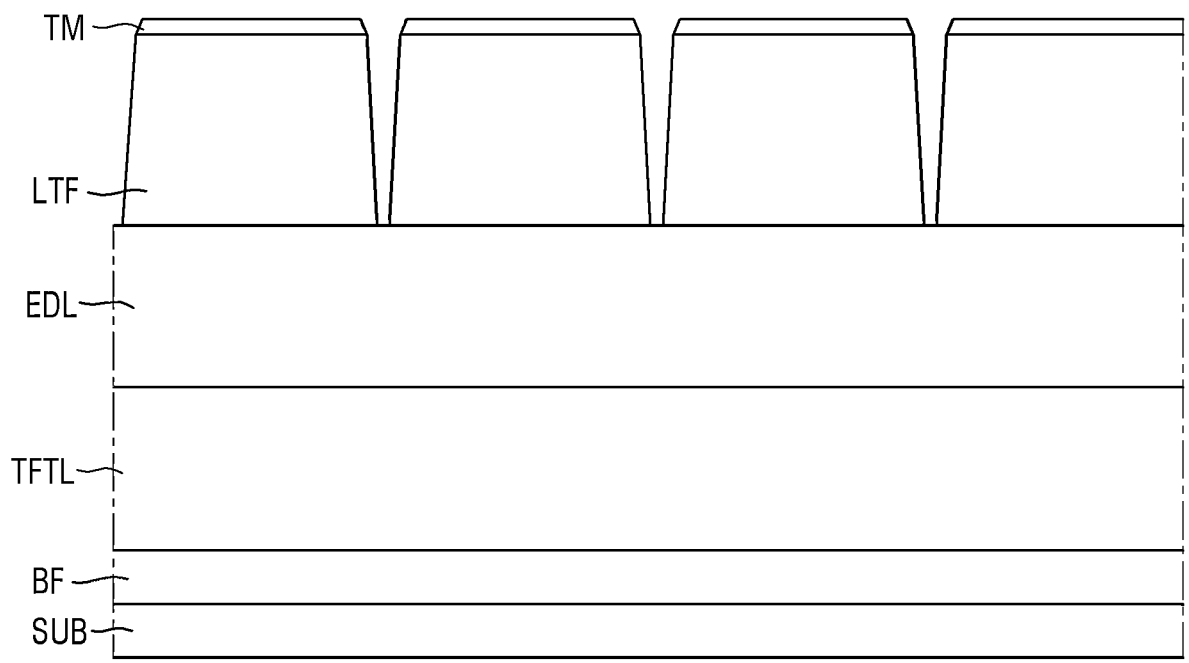

In FIG. 9, the light transmissive film LTF may be patterned by an etching process using the transparent mask TM as a mask. The light transmissive film LTF may be patterned according to the pattern of the transparent mask TM. For example, the light transmissive film LTF may be patterned through a dry etching process but is not limited thereto. The transparent mask TM and the light transmissive film LTF may be formed through separate patterning processes, and the side surface of the transparent mask TM and the side surface of the light transmissive film LTF may be shifted from each other.

Figure 10:
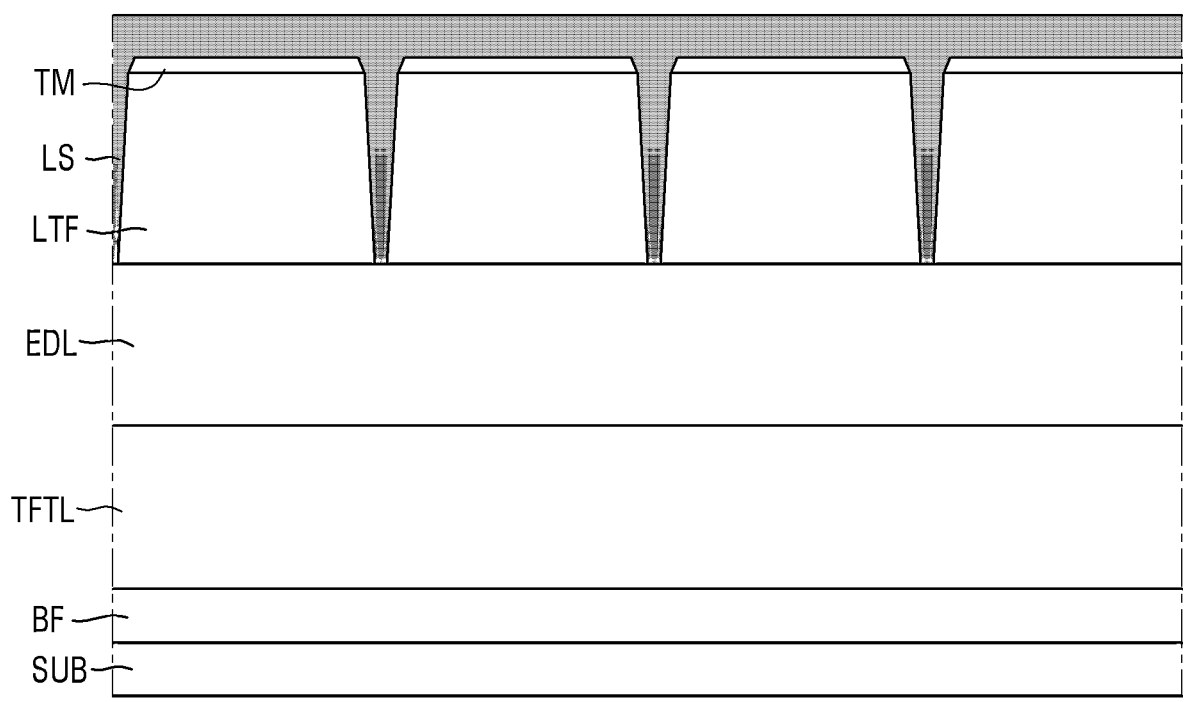

In FIG. 10, after the light transmissive film LTF is patterned, the material forming the light blocking patterns LS may fill an empty space surrounded by the light transmissive film LTF and the transparent mask TM. The material forming the light blocking patterns LS may be provided higher than the height of the transparent mask TM from the substrate SUB. For example, the material forming the light blocking patterns LS may include a black resin or a black matrix material.

Figure 11:
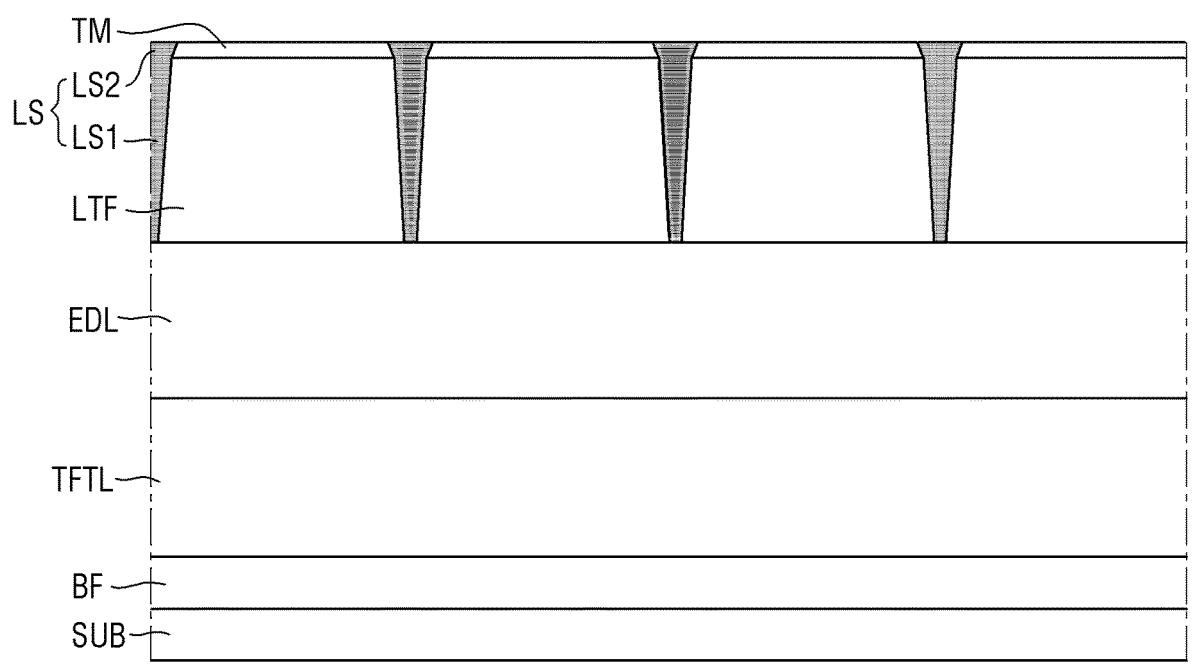

In FIG. 11, the material forming the light blocking patterns LS disposed higher than the transparent mask TM may be removed. The upper ends of the light blocking patterns LS may be planarized with respect to the upper end of the transparent mask TM through a polishing process. For example, the upper ends of the light blocking patterns LS may be planarized through a chemical mechanical polishing (CMP) process but are not necessarily limited thereto. Thus, the upper ends of the plurality of light blocking patterns LS may be disposed on the same plane as the upper end of the transparent mask TM.

Figure 12:
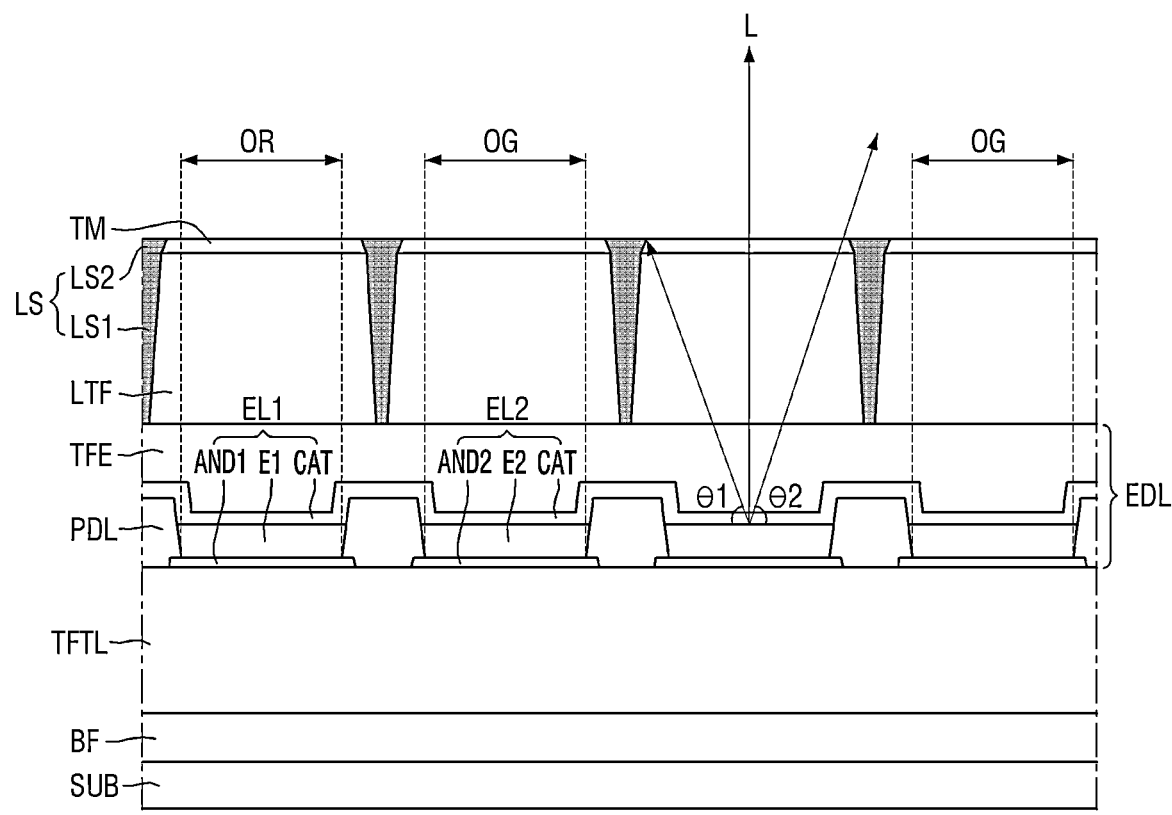
FIG. 12 is a diagram illustrating a viewing angle control of a display device according to an embodiment of the inventive concepts.

FIG. 12 is a diagram illustrating a viewing angle control of a display device according to an embodiment.

In FIG. 12, the first to third light emitting elements EL1, EL2 and EL3 may emit light L in a specific wavelength band through the first to third opening regions OR, OG and OB, respectively. For example, light emitted vertically from a plane on which the first to third light emitting elements EL1, EL2 and EL3 are disposed may be emitted to the front of the display device 10.

As another example, the light L emitted at a first angle θ1 from the plane where the first to third light emitting elements EL1, EL2 and EL3 are disposed may be absorbed by the light blocking patterns LS. That is, the light L emitted at an angle equal to or less than the first angle θ1 may be absorbed by the light blocking patterns LS, and the display device 10 may limit the viewing angle of the corresponding angle.

As still another example, the light L emitted at a second angle θ2 from the plane where the first to third light emitting elements EL1, EL2 and EL3 are disposed may be emitted in the corresponding direction without being absorbed by the light blocking patterns LS. That is, the light L emitted at an angle greater than or equal to the second angle θ2 may not be absorbed by the light blocking patterns LS and may correspond to the viewing angle range of the display device 10.

Therefore, the display device 10 can prevent an increase in thickness of the display panel 300 and control the viewing angle of the display device 10 while minimizing a decrease in luminance of the display panel 300.

Figure 13:
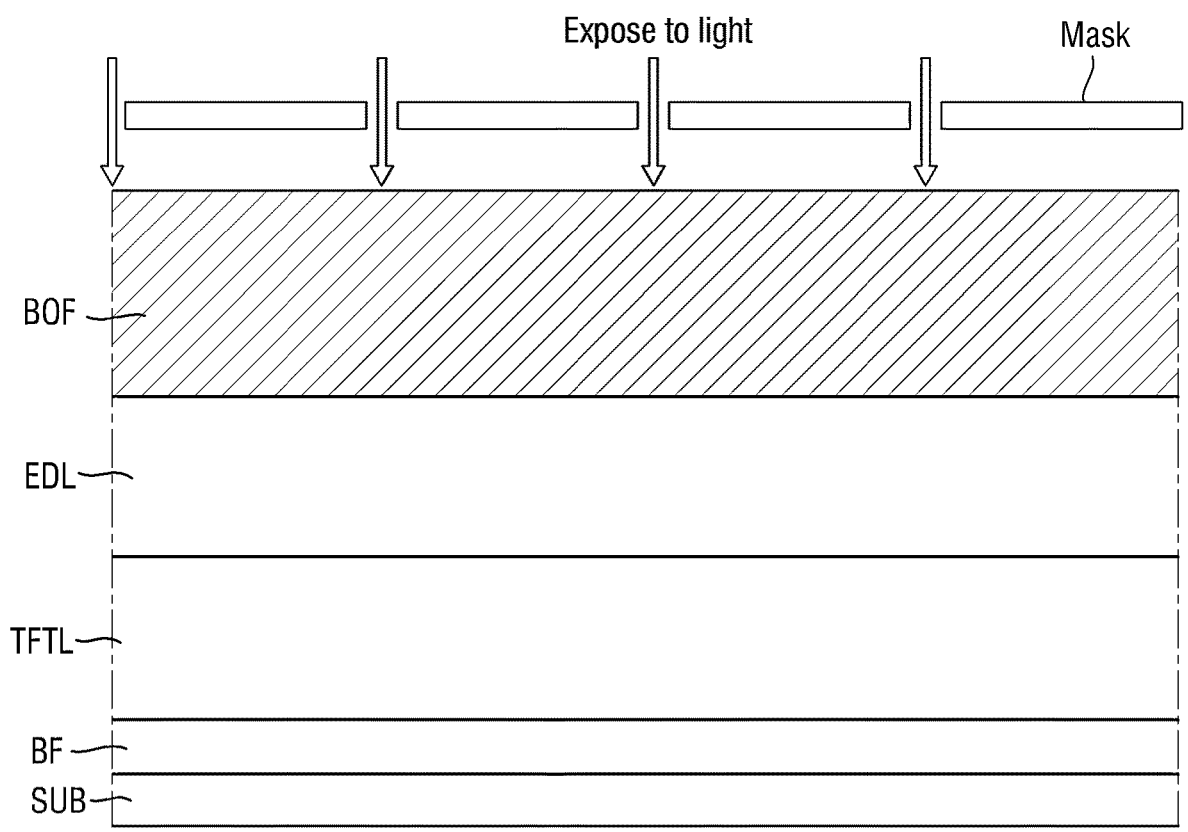
FIGS. 13, 14 and 15 are cross-sectional views illustrating a manufacturing process of a display device according to an embodiment of the inventive concepts.
Figure 14:
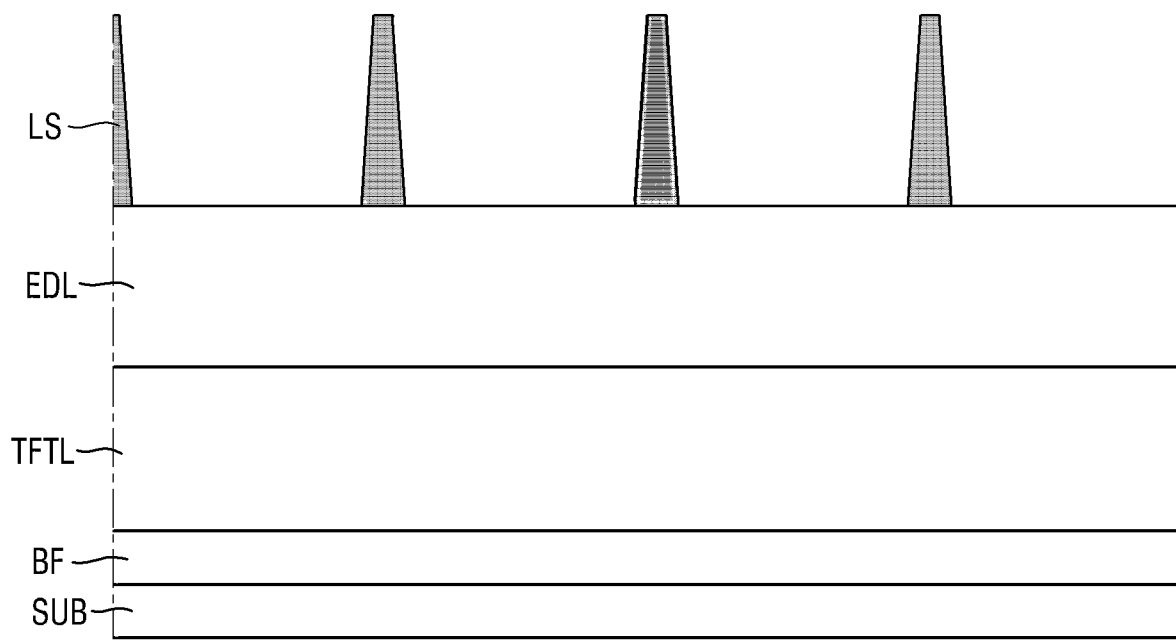
Figure 14:
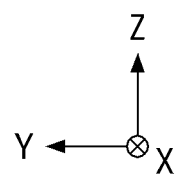
Figure 15:
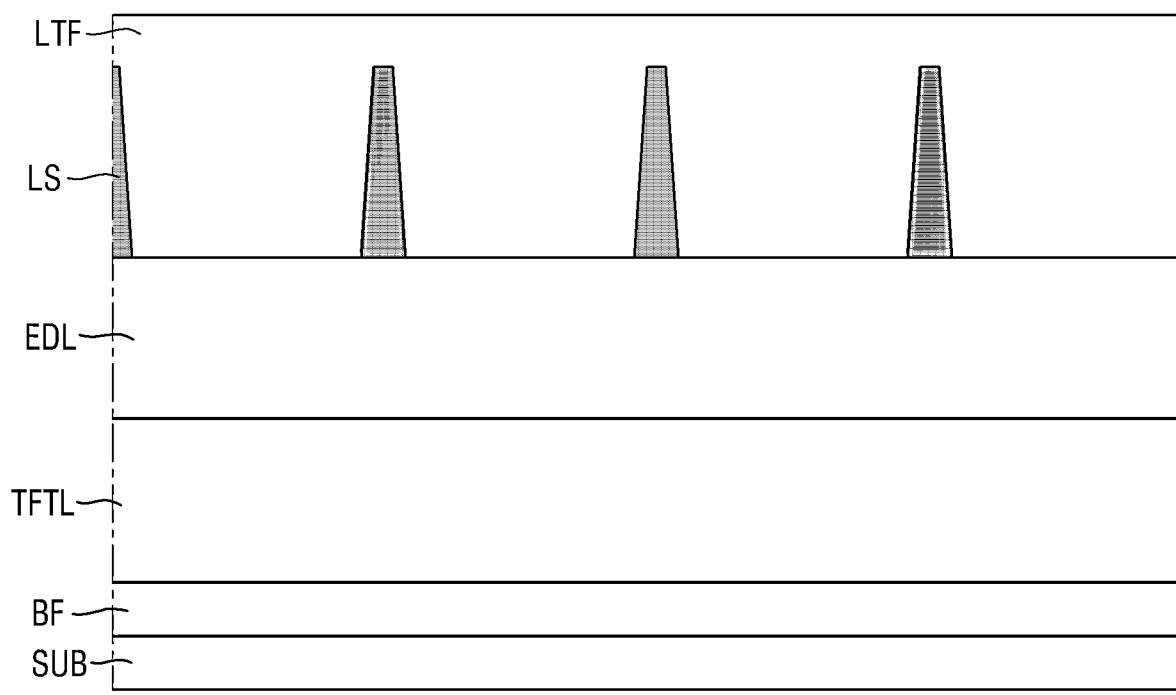

FIGS. 13, 14, and 15 are cross-sectional views illustrating a manufacturing process of a display device according to another embodiment.

In FIG. 13, a black organic film BOF may be provided on the encapsulation layer TFE of the light emitting element layer EDL. Here, the black organic film BOF may be patterned to form the plurality of light blocking patterns LS, and the thickness of the black organic film BOF may be determined according to the height of the light blocking patterns LS to be formed later. For example, the black organic film BOF may include a black resin or a black matrix material.

The black organic film BOF may include a photosensitive resin. For example, the photosensitive resin of the black organic film BOF may be implemented as a positive type using a solvent to leave a portion exposed to light after exposure to light. As another example, the photosensitive resin of the black organic film BOF may be implemented as a negative type using a solvent to leave a portion not exposed to light after exposure to light.

In FIG. 13, the mask may select a portion of the black organic film BOF exposed to light. The black organic film BOF may be exposed to light passing through the mask. For example, the pattern of the mask may determine a pattern of each of the light blocking patterns LS.

In FIG. 14, since the black organic film BOF is exposed to light and then dissolved using a solvent, a portion of the black organic film BOF exposed to light may remain. The remaining black organic film BOF may form the light blocking patterns LS.

In FIG. 15, the light transmissive film LTF may cover the light blocking patterns LS and the encapsulation layer TFE of the light emitting element layer EDL. For example, the light transmissive film LTF may be implemented as an organic film including at least one of polyimide-based resin, acryl-based resin, or siloxane-based resin. The light transmissive film LTF may transmit light emitted from each of the first to third opening regions OR, OG and OB.

Figure 16:
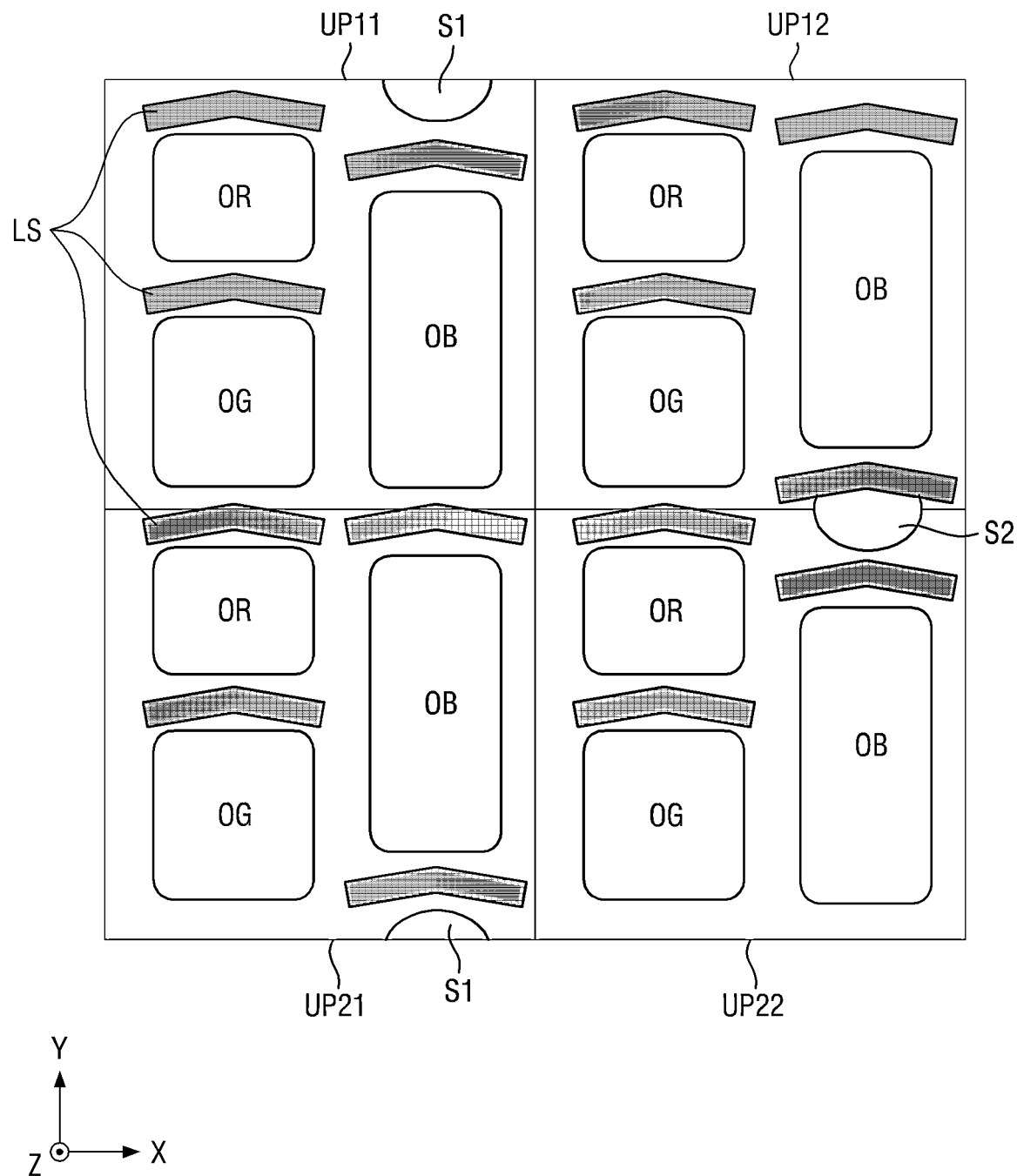
FIG. 16 is a plan view illustrating a plurality of unit pixels of a display device according to an embodiment of the inventive concepts.

FIG. 16 is a plan view illustrating a plurality of unit pixels of a display device according to another embodiment. The display device illustrated in FIG. 16 is different from the display device illustrated in FIG. 5 in the configuration of the light blocking patterns LS. The same configuration as the above-described configuration will be briefly described or omitted.

In FIG. 16, each of the first-first unit pixel UP11 to the second-second unit pixel UP22 may include first to third sub-pixels. The first sub-pixel may include a first opening region OR, the second sub-pixel may include a second opening region OG, and the third sub-pixel may include a third opening region OB. The first to third opening regions OR, OG and OB may be defined by a pixel defining layer. A light emitting element of each of the first to third sub-pixels may be disposed in each of the first to third opening regions OR, OG and OB to emit light of a specific wavelength band.

The plurality of light blocking patterns LS may be disposed between the plurality of opening regions. For example, each of the plurality of light blocking patterns LS may be disposed on the upper side of each of the first to third opening regions OR, OG and OB to block light emitted to the upper side of the display panel 300 from the first to third openings OR, OG and OB. In addition, the plurality of light blocking patterns LS do not overlap the first to third opening regions OR, OG and OB, and do not block light emitted to the left side or the right side of the first to third opening regions OR, OG and OB while blocking light emitted to the upper side or the lower side of the first to third opening regions OR, OG and OB, thereby minimizing a reduction in luminance of the display panel 300. Accordingly, the plurality of light blocking patterns LS may limit a light exit angle of each of the first to third opening regions OR, OG and OB, and minimize a reduction in luminance of the display panel 300 while controlling a viewing angle.

Each of the light blocking patterns LS may be disposed between the first, second and third openings OR, OG and OB adjacent in the second direction (Y-axis direction). For example, some of the plurality of light blocking patterns LS may be disposed between the first opening region OR and the second opening region OG adjacent in the second direction (Y-axis direction), thereby blocking light emitted to the upper or lower side of the display panel 300 from the first opening region OR or the second opening region OG. The other ones of the plurality of light blocking patterns LS may be disposed between the third opening regions OB adjacent in the second direction (Y-axis direction), thereby blocking light emitted to the upper or lower side of the display panel 300 from the third opening region OB.

Each of the light blocking patterns LS may be bent with respect to the center point. In FIG. 16, one end of each of the light blocking patterns LS may extend from the center point toward the lower left side, and the other end of each of the light blocking patterns LS may extend from the center point toward the lower right side. The center point of each of the light blocking patterns LS may be disposed above both ends of the light blocking patterns LS.

The shape of the light blocking patterns LS is not limited to the shape of the light blocking pattern LS shown in FIG. 16, and may be design-changed as necessary based on the shape of the opening regions, the viewing angle control, and other conditions of the display panel 300.

Figure 17:
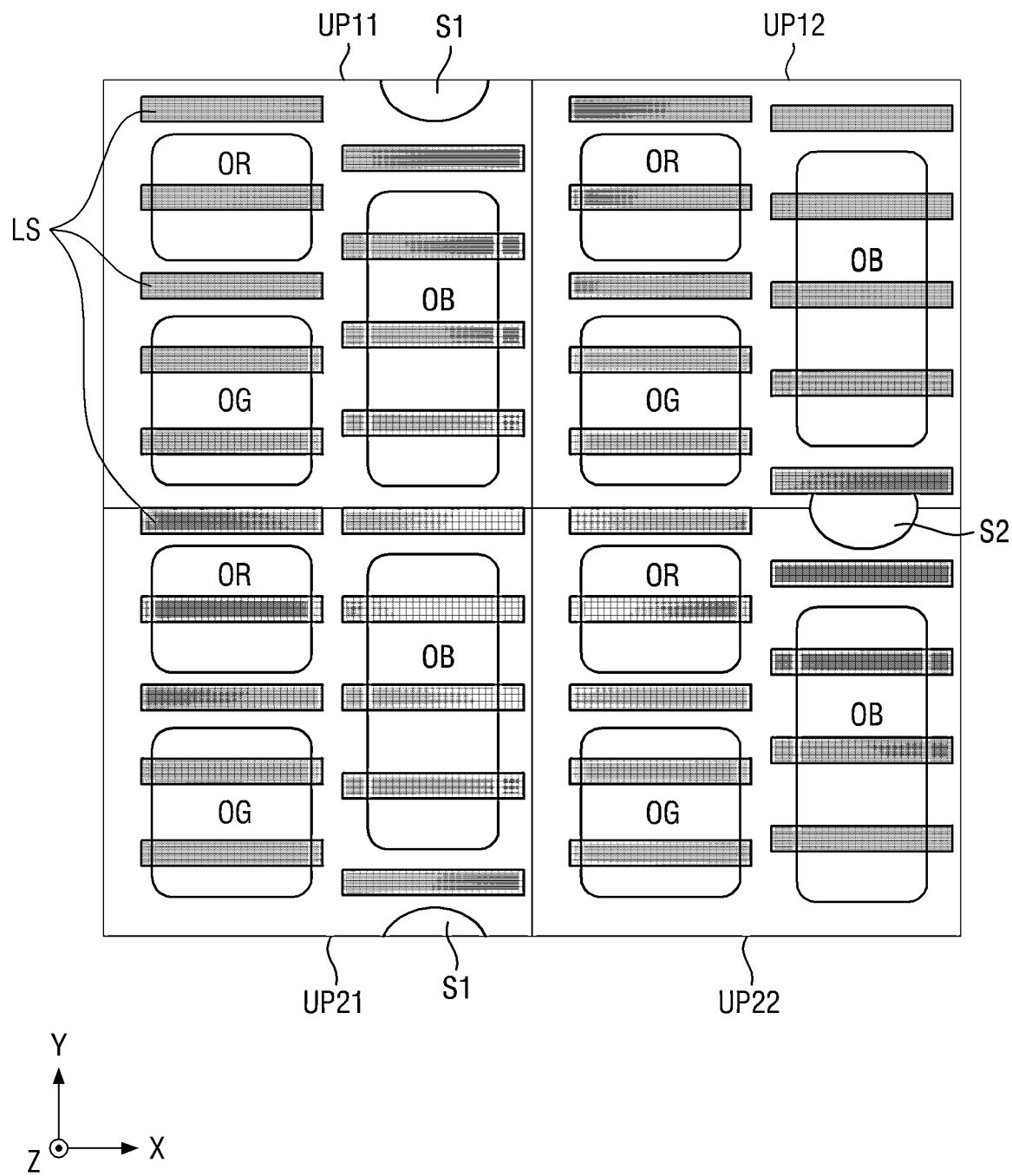
FIG. 17 is a plan view illustrating a plurality of unit pixels of a display device according to an embodiment of the inventive concepts.

FIG. 17 is a plan view illustrating a plurality of unit pixels of a display device according to another embodiment. The display device illustrated in FIG. 17 is different from the display devices illustrated in FIGS. 5 and 16 in the configuration of the light blocking patterns LS. The same configuration as the above-described configuration will be briefly described or omitted.

In FIG. 17, each of the first-first unit pixel UP11 to the second-second unit pixel UP22 may include first to third sub-pixels. The first sub-pixel may include a first opening region OR, the second sub-pixel may include a second opening region OG, and the third sub-pixel may include a third opening region OB.

The light blocking patterns LS may extend in the first direction (X-axis direction) and may be spaced apart from each other in the second direction (Y-axis direction) perpendicular to the first direction. The light blocking patterns LS may include a plurality of light blocking patterns LS corresponding to the first to third opening regions OR, OG and OB, respectively.

For example, some of the light blocking patterns LS may overlap the first to third opening regions OR, OG and OB in the thickness direction. The other ones of the light blocking patterns LS may overlap the pixel defining layer PDL in the thickness direction without overlapping the first to third opening regions OR, OG and OB in the thickness direction.

For example, the length of each of the light blocking patterns LS in the first direction (X-axis direction) may correspond to the length of each of the first to third opening regions OR, OG and OB in the first direction (X-axis direction), but the present disclosure is not limited thereto.

The display device 10 illustrated in FIG. 17 includes some light blocking patterns LS overlapping the first to third opening regions OR, OG and OB and the other light blocking patterns LS overlapping the pixel defining layer PDL, thereby further limiting the viewing angle than the display device 10 illustrated in FIG. 5 or 16. Further, the display device 10 illustrated in FIG. 17 can realize the same viewing angle as the display device 10 shown in FIG. 5 or 16 by using the light blocking patterns LS having a height (e.g., a length in the third direction or the Z-axis direction) smaller than the display device 10 illustrated in FIG. 5 or 16.

Figure 18:
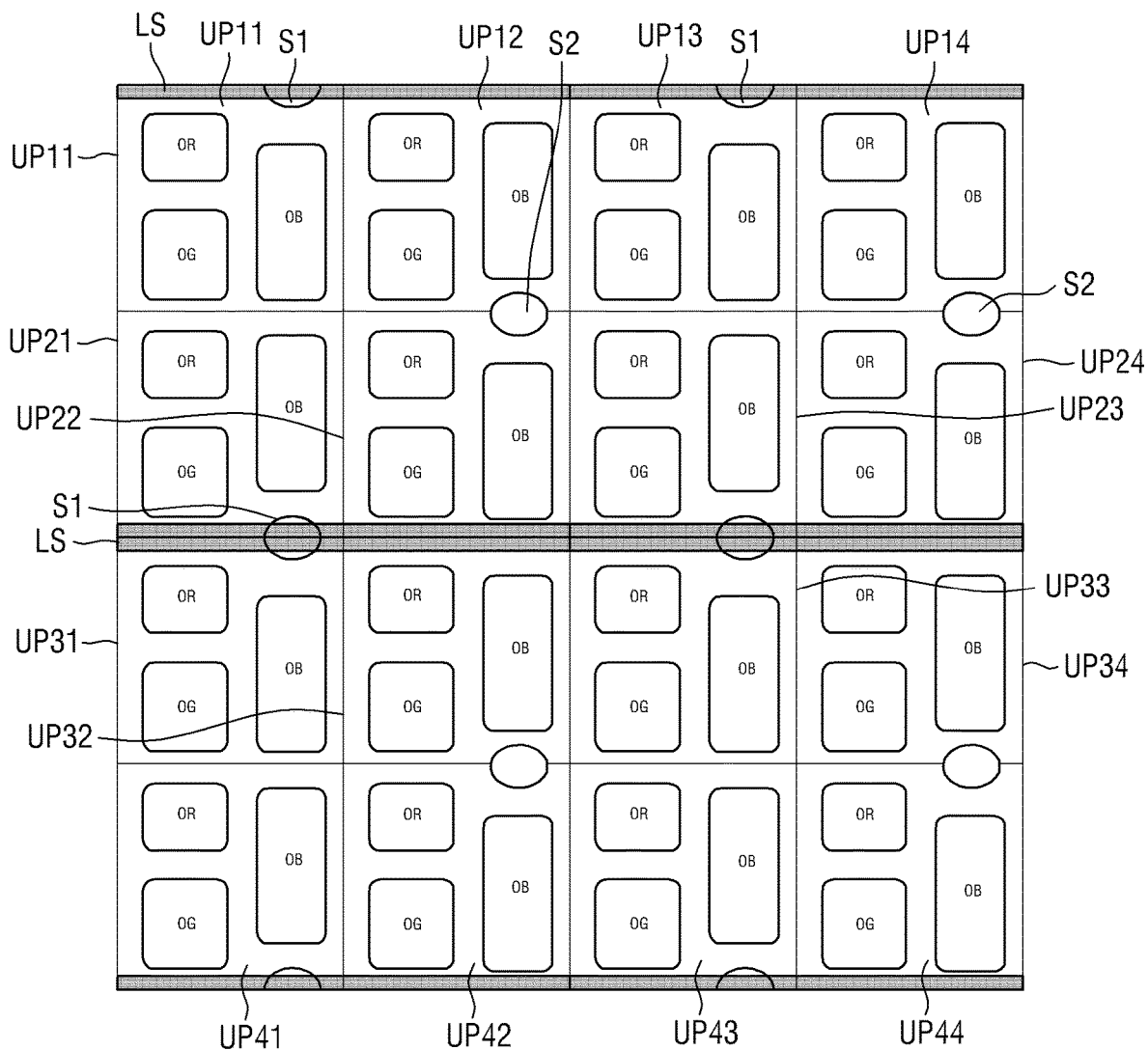
FIG. 18 is a plan view illustrating a plurality of unit pixels of a display device according to embodiment of the inventive concepts.

FIG. 18 is a plan view illustrating a plurality of unit pixels of a display device according to another embodiment. The display device illustrated in FIG. 18 is different from the display devices illustrated in FIGS. 5, 16 and 17 in the configuration of the light blocking patterns LS. The same configuration as the above-described configuration will be briefly described or omitted.

In FIG. 18, the display area DA of the display panel 300 may include a plurality of unit pixels. For example, the plurality of unit pixels may include a first-first unit pixel UP11 to a fourth-fourth unit pixel UP44 arranged in four rows and four columns.

Each of the first-first unit pixel UP11 to the fourth-fourth unit pixel UP44 may include first to third sub-pixels displaying different colors. The first sub-pixel may include a first opening region OR, the second sub-pixel may include a second opening region OG, and the third sub-pixel may include a third opening region OB.

The plurality of unit pixels may include unit pixel groups including some unit pixels. For example, the plurality of unit pixels may include a first unit pixel group consisting of the first-first unit pixel UP11 to the second-fourth unit pixel UP24, and a second unit pixel group consisting of the third-first unit pixel UP31 to the fourth-fourth unit pixel UP44. The first unit pixel group and the second unit pixel group may be adjacent to each other in the second direction (Y-axis direction).

The light blocking patterns LS may extend in the first direction (X-axis direction) and may be spaced apart from each other in the second direction (Y-axis direction) perpendicular to the first direction. Each of the light blocking patterns LS may be disposed between the unit pixel groups adjacent to each other in the second direction (Y-axis direction). For example, each of the light blocking patterns LS may be disposed between the first unit pixel group and the second unit pixel group. Each of the plurality of light blocking patterns LS may be disposed at the boundary between the unit pixel groups adjacent to each other in the second direction, and may not overlap the first to third opening regions OR, OG and OB. Accordingly, the light blocking patterns LS may block light emitted to the upper side or the lower side of the display panel 300 from the unit pixel groups.

Therefore, the display device 10 illustrated in FIG. 18 can minimize the arrangement of the plurality of light blocking patterns LS, thereby further minimizing a reduction in luminance of the display panel 300 compared to the display device 10 illustrated in FIG. 5, 16, or 17.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a plurality of first electrodes electrically connected to pixel circuits disposed on a substrate;
   a pixel defining layer defining a plurality of opening regions, each of the opening regions exposing a portion of each of the first electrodes;
   a plurality of light emitting layers respectively disposed on the first electrodes in the opening regions;
   a second electrode covering the light emitting layers and the pixel defining layer;
   an encapsulation layer disposed on the second electrode; and
   a plurality of light blocking patterns disposed on the encapsulation layer and extending in a first direction,
   wherein each of the light blocking patterns traverses one of the plurality of opening regions in plan view.

2. The display device of claim 1, wherein at least two of the plurality of light blocking patterns traverses one of the plurality of opening regions in plan view.

3. The display device of claim 1, wherein the plurality of light blocking patterns include a first light blocking pattern and the plurality of opening regions include a first opening region which the first light blocking pattern traverse in plan view, and
   wherein the first light blocking pattern divides the first opening region into a first portion located at one side of the first light blocking pattern and a second portion located at the other side of the first light blocking pattern.

4. The display device of claim 3, wherein lengths of the first light blocking patterns in the first direction are greater than widths of the opening regions in the first direction.

5. The display device of claim 1, wherein the plurality of the opening regions are arranged in a matrix including a plurality of rows extending in the first direction and a plurality of columns extending in a second direction crossing the first direction.

6. The display device of claim 5, wherein the plurality of light blocking patterns include a first light blocking pattern and the plurality of opening regions include a first opening region which the first light blocking pattern traverse in plan view, and
   wherein the first light blocking pattern does not extend to the opening regions adjacent to the first opening region in the first direction.

7. The display device of claim 1, further comprising:
   a light transmissive film disposed on the encapsulation layer so as to overlap the opening regions and surrounding each of the light blocking patterns in plan view; and
   a transparent mask disposed on the light transmissive film and surrounding each of the light blocking patterns in plan view.

8. The display device of claim 7, wherein each of the light blocking patterns includes:
   a first portion surrounded by the light transmissive film; and
   a second portion disposed on the first portion and surrounded by the transparent mask.

9. The display device of claim 8, wherein one surface of the second portion is bent from one surface of the first portion.

10. The display device of claim 7, wherein an upper end of the transparent mask and upper ends of the plurality of the light blocking patterns are disposed on the same plane.

11. A display device comprising:
    a plurality of first electrodes electrically connected to pixel circuits disposed on a substrate;
    a pixel defining layer defining a plurality of opening regions, each of the opening regions exposing a portion of each of the first electrodes;
    a plurality of light emitting layers respectively disposed on the first electrodes in the opening regions;
    a plurality of spacers disposed on the pixel defining layer between some opening regions among the plurality of opening regions;
    a second electrode covering the light emitting layers, the pixel defining layer and the spacers;
    an encapsulation layer disposed on the second electrode; and
    a plurality of light blocking patterns extending in a first direction and spaced apart from each other in a second direction perpendicular to the first direction;
    wherein each of the light blocking patterns traverses one of the plurality of opening regions in plan view.

12. The display device of claim 11, wherein at least two of the plurality of light blocking patterns traverses one of the plurality of opening regions in plan view.

13. The display device of claim 11, wherein the plurality of light blocking patterns include a first light blocking pattern and the plurality of opening regions include a first opening region which the first light blocking pattern traverse in plan view, and wherein the first light blocking pattern divides the first opening region into a first portion located at one side of the first light blocking pattern and a second portion located at the other side of the first light blocking pattern.

14. The display device of claim 13, wherein lengths of the first light blocking patterns in the first direction are greater than widths of the opening regions in the first direction.

15. The display device of claim 11, wherein the plurality of the opening regions are arranged in a matrix including a plurality of rows extending in the first direction and a plurality of columns extending in the second direction.

16. The display device of claim 15, wherein the plurality of light blocking patterns include a first light blocking pattern and the plurality of opening regions include a first opening region which the first light blocking pattern traverse in the plan view, and Wherein the first light blocking pattern does not extend to the opening regions adjacent to the first opening region in the first direction.

17. The display device of claim 11, further comprising:
a light transmissive film disposed on the encapsulation layer so as to overlap the opening regions and surrounding each of the light blocking patterns in plan view; and
a transparent mask disposed on the light transmissive film and surrounding each of the light blocking patterns in plan view.

18. The display device of claim 3, wherein each of the light blocking patterns includes:
a first portion surrounded by the light transmissive film; and
a second portion disposed on the first portion and surrounded by the transparent mask.

19. The display device of claim 18, wherein one surface of the second portion is bent from one surface of the first portion.

20. The display device of claim 17, wherein an upper end of the transparent mask and upper ends of the plurality of the light blocking patterns are disposed on the same plane.

* * * * *